(12) United States Patent
Ristic et al.

(10) Patent No.: US 11,513,178 B2
(45) Date of Patent: Nov. 29, 2022

(54) TRANSVERSE FIELD MRI APPARATUS

(71) Applicant: Imperial College of Science, Technology and Medicine, London (GB)

(72) Inventors: Mihailo Ristic, London (GB); John Vincent Mario McGinley, London (GB); Ian Robert Young, London (GB)

(73) Assignee: Imperial College of Science, Technology and Medicine, London (GB)

( * ) Notice: Subject to any disclaimer, the term of this patent is extended or adjusted under 35 U.S.C. 154(b) by 49 days.

(21) Appl. No.: 16/798,944

(22) Filed: Feb. 24, 2020

(65) Prior Publication Data

US 2020/0264254 A1 Aug. 20, 2020

Related U.S. Application Data

(62) Division of application No. 15/304,330, filed as application No. PCT/GB2015/051148 on Apr. 15, 2015, now Pat. No. 10,605,884.

(30) Foreign Application Priority Data

Apr. 15, 2014 (GB) .................................... 1406780
Apr. 15, 2014 (GB) .................................... 1406801

(51) Int. Cl.
*G01R 33/565* (2006.01)
*G01R 33/38* (2006.01)
(Continued)

(52) U.S. Cl.
CPC ... *G01R 33/56563* (2013.01); *G01R 33/3802* (2013.01); *G01R 33/383* (2013.01);
(Continued)

(58) Field of Classification Search
None
See application file for complete search history.

(56) References Cited

U.S. PATENT DOCUMENTS 4,758,813 A 7/1988 Holsinger et al.
5,153,546 A 10/1992 Laskaris
(Continued)

FOREIGN PATENT DOCUMENTS

EP 2226815 A2 9/2010
WO 01/31358 A1 5/2001
(Continued)

OTHER PUBLICATIONS

An Algorithm for the Calculation of Three-Dimensional Collagen Fiber Orientation in Ligaments Using Angle-Sensitive MRI, Siedel et al. 2013, Magnetic Resonance in Medicine (Year: 2013).*
(Continued)

*Primary Examiner* — Douglas X Rodriguez
(74) *Attorney, Agent, or Firm* — Eversheds Sutherland (US) LLP

(57) ABSTRACT

The invention relates to an MRI apparatus and a method of MRI involving the acquisition of a first and a second MRI image with mutually different orientations between the BO magnetic field and the object to be investigated. For instance, when imaging structures such as a tendon, due to the magic angle effect, this results in a change in image contrast. According to the invention, a coregistration can be performed between the first and the second MRI image. Moreover, the orientation of a structure within the object can be determined on the basis of the different orientations and the image intensity in the first and the second MRI image. The invention further discloses an apparatus for carrying out the method and a method of shimming the BO magnetic field of the apparatus.

20 Claims, 7 Drawing Sheets

(51) Int. Cl.
*G01R 33/383* (2006.01)
*G01R 33/3873* (2006.01)
*G01R 33/44* (2006.01)
*G01R 33/3875* (2006.01)

(52) U.S. Cl.
CPC ..... *G01R 33/3806* (2013.01); *G01R 33/3873* (2013.01); *G01R 33/445* (2013.01); *G01R 33/3875* (2013.01)

(56) References Cited

U.S. PATENT DOCUMENTS

| | | | |
|---|---|---|---|
| 5,436,607 | A | 7/1995 | Chari et al. |
| 5,667,469 | A | 9/1997 | Zhang et al. |
| 6,131,690 | A | 10/2000 | Galando |
| 6,157,278 | A | 12/2000 | Katznelson |
| 6,630,879 | B1 | 10/2003 | Creighton, IV et al. |
| 6,950,001 | B2 | 9/2005 | Kruip et al. |
| 7,535,329 | B2 | 5/2009 | Gorshkov |
| 7,538,553 | B2 | 5/2009 | Trequattrini et al. |
| 7,977,946 | B2 | 7/2011 | Teklemariam et al. |
| 8,077,002 | B2 | 12/2011 | Lian et al. |
| 10,596,393 | B2 * | 3/2020 | Stanescu ............... A61B 6/4417 |
| 2003/0006772 | A1 | 1/2003 | Westphal |
| 2007/0145979 | A1 | 6/2007 | Roland |
| 2008/0116889 | A1 * | 5/2008 | Hu ..................... G01R 33/485 324/309 |
| 2011/0267072 | A1 | 10/2011 | Carlone |
| 2011/0273177 | A1 | 11/2011 | McGinley et al. |
| 2014/0111202 | A1 * | 4/2014 | Wald .................... G01R 33/383 324/309 |

FOREIGN PATENT DOCUMENTS

| | | |
|---|---|---|
| WO | 02/065149 A1 | 8/2002 |
| WO | 2010/049700 A1 | 5/2010 |
| WO | 2013/187924 A1 | 12/2013 |

OTHER PUBLICATIONS

PCT International Search Report PCT Application No. PCT/GB2015/051148 dated Oct. 20, 2015 (6 pages).
GB Search and Examination Report for GB Application No. 1406801.9 dated Oct. 15, 2014 (7 pages).
GB Search and Examination Report for GB Application No. 1406780.5 dated Oct. 15, 2014 (9 pages).
Coey, "Permanent Magnet Applications," Journal of Magnetism and Magnetic Materials, 2002, 248:441-456.
Cugat et al., "Permanent Magnet Variable Flux Sources," IEEE Transactions on Magnetics, 1994, 30(6):4602-4604.
Elhawary et al., "A MR Compatible Mechatronic System to Facilitate Magic Angle Experiments in Vivo," MICCAI, 2007, Part II, LNCS 4792, pp. 604-611.
Garnov et al., "Angle-Sensitive MRI for Quantitative Analysis of Fiber-Network Deformations in Compressed Cartilage," Magnetic Resonance in Medicine, 2013, 70:225-231.
Hills et al., "A Low-Field, Low-Cost Halbach Magnet Array for Open-Access NMR," Journal of Magnetic Resonance, 2005, 175:336-339.
Schlueter et al., "Magic Angle Rotating Field NMR/MRI Magnet for In Vivo Monitoring of Tissue," IEEE Transactions on Applied Superconductivity, 2008, 18(2):864 867.
Schultz et al., "Radial Imaging with Multipolar Magnetic Encoding Fields," IEEE Trans Med Imaging, 2011, 30 (12):2134-2145.
Seidel et al., "An Algorithm for the Calculation of Three-Dimensional Collagen Fiber Orientation in Ligaments Using Angle-Sensitive MRI," Magnetic Resonance in Medicine, 2013, 69:1595-1602.
Szeverenyi et al., "Study of the Vertical Striations in Articular Cartilage Using Dipolar Anisotropy Fiber Imaging," Proct. Intl. Soc. Mag. Reson. Med., 2012, 20:3300.

* cited by examiner

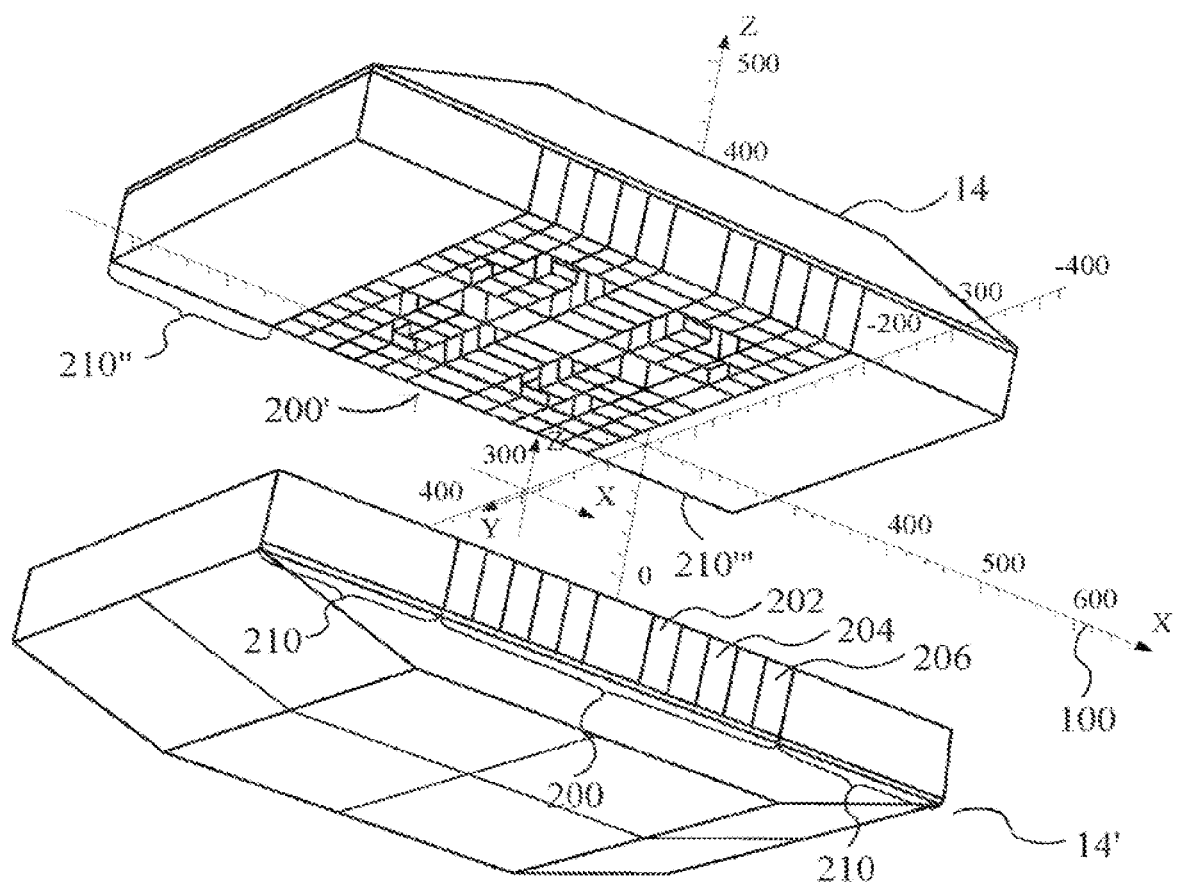

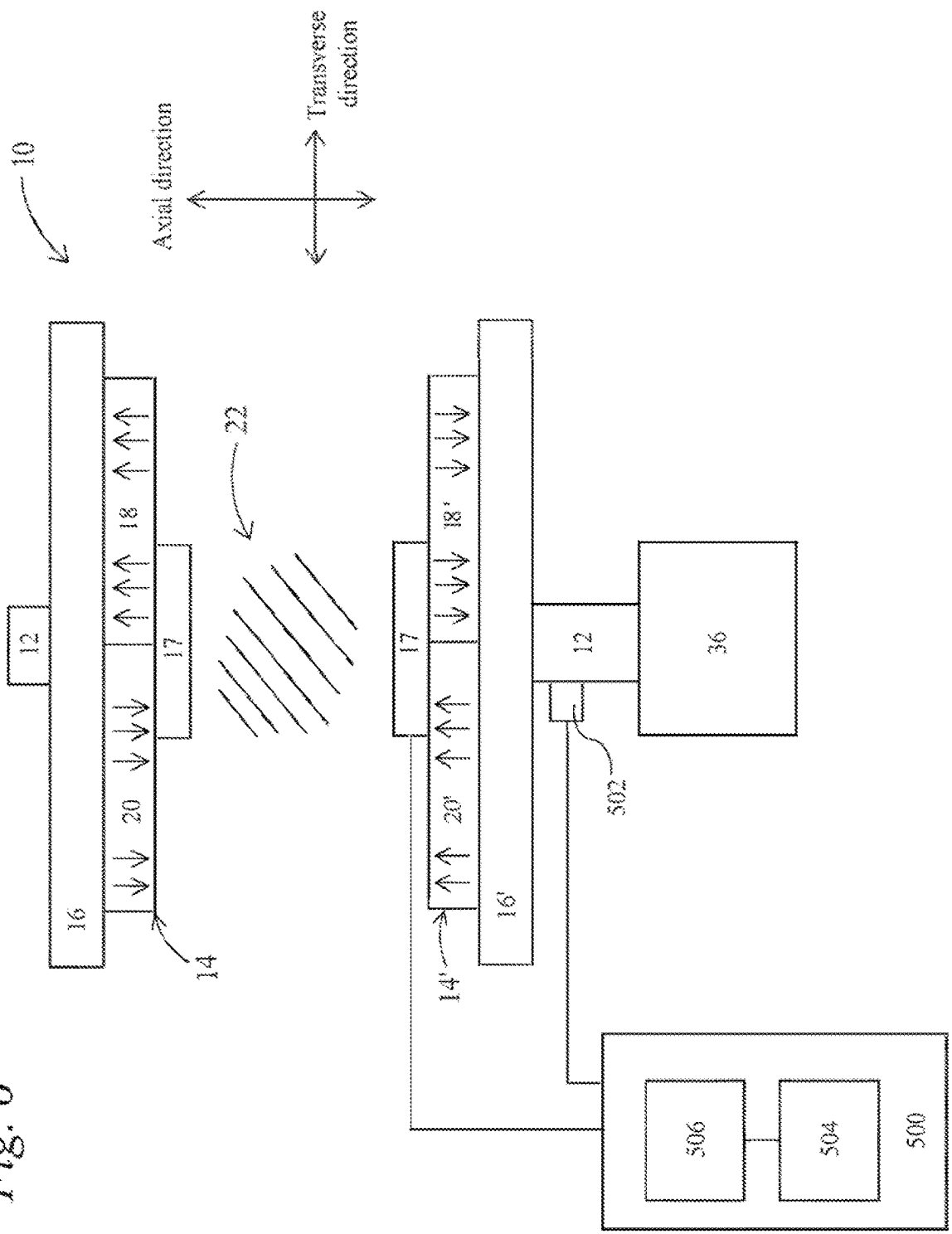

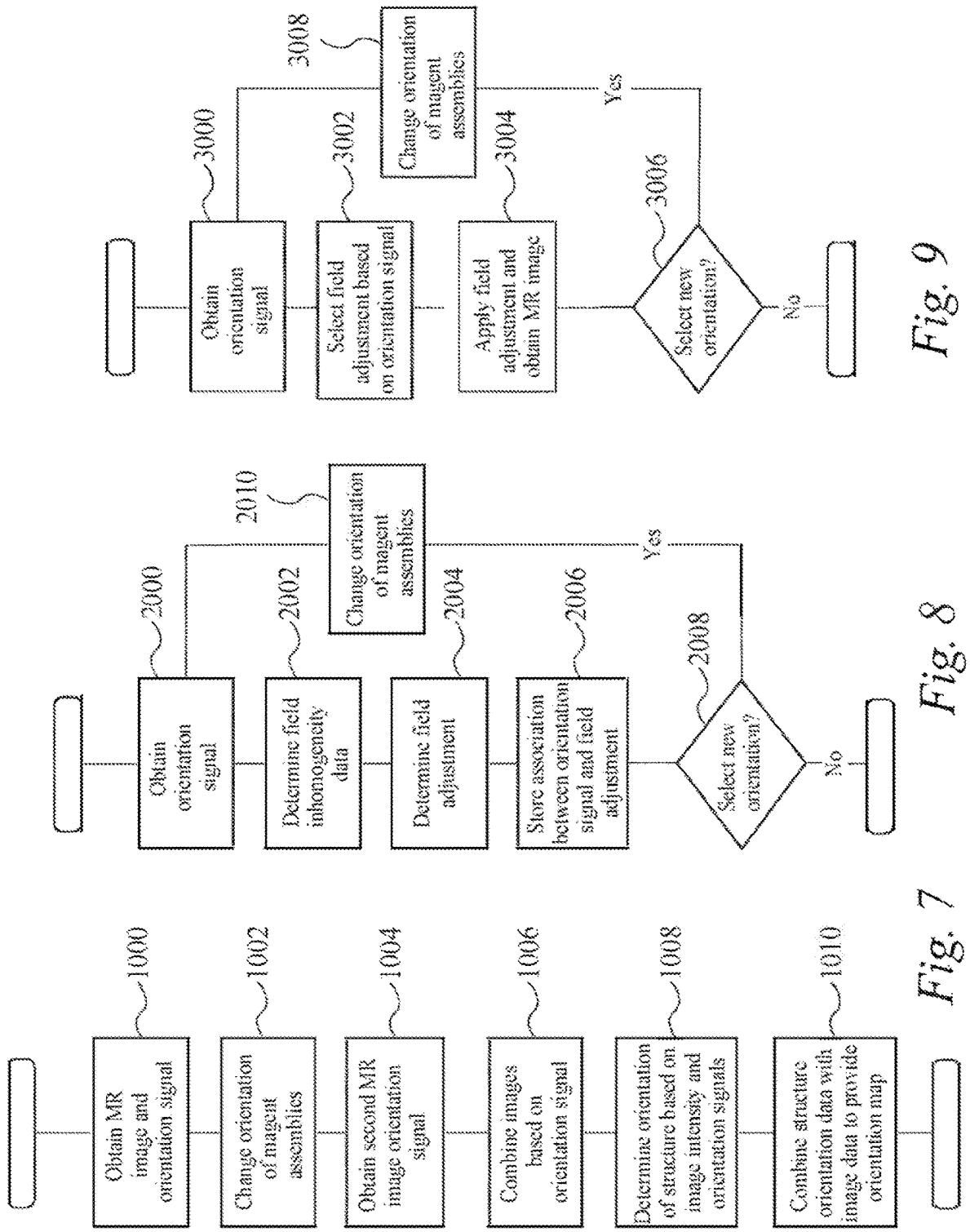

TRANSVERSE FIELD MRI APPARATUS

CROSS REFERENCES TO RELATED APPLICATIONS

This application is a divisional of U.S. application Ser. No. 15/304,330, filed Oct. 14, 2016, which is a U.S. national stage application of PCT/GB2015/051148, filed Apr. 15, 2015, which claims priority to Great Britain Application Nos. 1406801.9 and 1406780.5, both filed Apr. 15, 2014. The contents of these applications are hereby incorporated by reference.

BACKGROUND

The present disclosure relates to apparatus and methods for magnetic resonance imaging, and more particularly to apparatus and methods adapted to exploit image contrast based on magic angle effects.

Magnetic resonance imaging, MRI, is typically performed in the presence of a main magnetic field, $B_0$, that determines the central frequency of imaging sequences performed using the apparatus. To perform imaging it is desirable that this $B_0$ imaging field should be generally homogeneous in an imaging region. Objects to be imaged can be arranged in this region to enable magnetic resonance images to be acquired.

Conventional MRI magnets typically take one of two common forms: (1) cylindrical electromagnets having a net magnetic dipole aligned with the axis of the cylinder; and (2) open magnets involving two poles, North and South, which provide a field between the two poles that is aligned with their direction of separation. In both of these cases, the $B_0$ imaging field is generally aligned with the net magnetisation, or the net magnetic dipole as the case may be, of the magnetic elements that provide that field.

This imaging is generally conducted by applying a pulse of RF magnetic field, centred at the resonant frequency defined by the $B_0$ imaging field, and superimposing magnetic field gradients on the (otherwise homogeneous) $B_0$ field. The RF signal produced by the relaxation, in the presence of these gradients, of nuclei excited by this RF pulse can then be used to reconstruct an image of an object in the imaging region.

In some types of objects, components of the object may be arranged in organised, anisotropic, structures. For example in human or animal tissues, and peripheral nerves and musculoskeletal tissues in particular, materials such as collagen may be arranged in anisotropic structures such as tubes and fibres. It has been found that magnetic nuclei, such as water protons, bound in such structures are subject to dipolar interactions whose strength depends on the orientation of the structures with respect to the $B_0$ field.

In more detail, the relaxation of nuclei is modified by their local magnetic environments, and by dipole-dipole interactions. In these anisotropic structures dipolar interactions are modulated by a term which varies as $3\cos^2\theta - 1$, where $\theta$ is the angle the structures make with the magnetic field $B_0$. At angles where the term $3\cos^2\theta - 1$ is small these dipolar interactions are reduced with the result that the transverse relaxation time T2 of these tissues is increased. This so called "magic angle" effect is known to be a source of image artefact which makes imaging of the musculoskeletal system a difficult problem. Such effects are normally seen as a source of image artefacts because they may cause contrast to appear in regions that would otherwise be expected produce no or little MR signal.

One way to address this artefact is to position structures and tissues at particular orientations with respect to $B_0$ to increase the signal from them. Signal to noise ratio, and the control of image contrast may nonetheless remain a challenge.

The magic angle effect may be exploited by deliberately positioning the structures and tissues at particular orientations with respect to $B_0$ in order to increase the signal from them. In this way diagnostically useful images may be obtained for tissues that would otherwise produce little or no signal. However conventional cylindrical and open MRI magnets are not generally well suited for this task because of the physical constraints in achieving the required orientations of the magnet relative to the patient.

Aspects and examples of the disclosure are set out in the appended claims.

BRIEF DESCRIPTION OF THE DRAWINGS

A specific description of some embodiments is provided, by way of non-limiting example only, with reference to the accompanying drawings, in which:

FIG. 4A shows a perspective view of two magnet assemblies superimposed on a set of 3D Cartesian axes centred on the centre of an imaging region between the two magnet assemblies;

FIG. 6 shows a very schematic illustration of a transverse field MRI apparatus;

FIG. 7 shows a flow chart illustrating a method of determining the orientation of a structure in an object;

FIG. 8 shows a flow chart illustrating a method of calibrating an MRI apparatus; and FIG. 9 shows a flow chart illustrating a method of calibrating an MRI apparatus.

DETAILED DESCRIPTION

Figure 1:
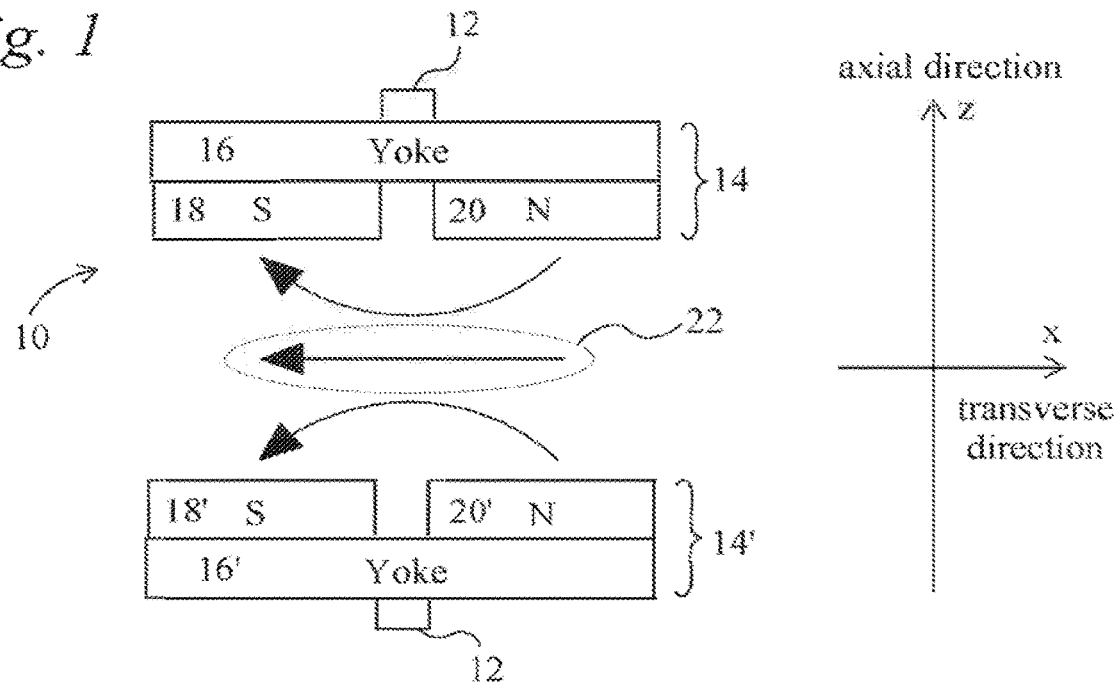
FIG. 1 shows a very schematic illustration of an apparatus for use in a transverse field MRI system.

Image contrast can be provided based on the magic angle effect, and orientation of structured tissues. In order to provide a homogeneous $B_0$ field however, conventional imaging systems typically employ an axial field in which the direction of the $B_0$ field is parallel with the net magnetisation, or magnetic dipole moment, of the magnet or magnetic elements that provide that $B_0$ imaging field. Whether that magnet assembly comprises magnetic elements which are superconductive or ohmic electromagnets, or permanent magnets, or a combination thereof, the orientation of the field, and access to the imaging region of the imaging system, is constrained by the geometry of the magnet assembly.

The present disclosure provides a transverse field MRI apparatus. This apparatus may comprise two magnet assemblies spaced apart to provide an imaging region between them. In such a transverse field MRI apparatus, the $B_0$ imaging field is transverse to the direction of separation of the magnet assemblies.

Each such magnet assembly may be arranged in two halves. One half of each magnet assembly may provide a "North" pole having a net magnetisation directed into the imaging region, e.g. aligned with the direction of separation of the two magnet assemblies. The other half of each magnet assembly may provide a "South" pole, having a net magnetisation directed in the opposite direction, e.g. aligned with the direction of separation but pointing away from the imaging region. The North poles may be arranged towards the same end of each magnet assembly, and the South poles may be arranged towards the other end so that the North poles face each other at one end of the imaging region and South poles face each other at the other end of the imaging region. The North and South pole of each magnet assembly may comprise an array of magnetic elements.

Some embodiments of the present disclosure relate to the configuration of magnet assemblies for transverse field imaging. Some other embodiments of the disclosure relate to the rotation of the $B_0$ imaging field with respect to a stationary object to provide image contrast between differently oriented structures in that object.

A transverse $B_0$ imaging field can be provided in an imaging region between two magnet assemblies. This transverse $B_0$ field may be perpendicular, or nearly perpendicular, to the direction of separation of the magnet assemblies. In this configuration the $B_0$ imaging field can be rotated through a large angle, such as 180°, 270°, or 360° with respect to the imaging region by rotating the magnet assemblies about an axis aligned with their direction of separation. An object to be imaged however may be held fixed as the magnet assemblies, and hence the $B_0$ field, are rotated. This can avoid or mitigate movement artefact and other errors which might otherwise arise.

This option to rotate the $B_0$ field with respect to an imaging system may be further enhanced in a transverse field imaging apparatus where the two magnet assemblies comprise separate yokes. For example, two yokes may be mechanically coupled together and held spaced apart either side of the imaging region by a rigid separator. The separator may comprise a material of lower magnetic permeability than the yokes.

The separator may comprise a rotatable mounting to enable the magnet assemblies to be rotated with respect to the separator and/or the imaging region. This can permit the magnet assemblies and the B0 field to be rotated whilst an object is held stationary in the imaging region. For example, a patient's limb may be held still or immobilised in the imaging region whilst the B0 field is rotated, but because the yokes are separate, and can rotate, the patient's limb can remain still.

The present disclosure also provides an imaging method and imaging apparatus. In some embodiments the methods and apparatus may employ a transverse B0 imaging field. For example the apparatus may comprise two magnet assemblies spaced apart to provide an imaging region between them. In such a transverse field MRI apparatus, the B0 imaging field is transverse to the direction of separation of the magnet assemblies. Axial field systems may also be used.

Some embodiments of the present disclosure relate to MRI methods, methods for controlling MRI apparatus, and methods for processing magnetic resonance images. These methods may involve the rotation of a B0 imaging field with respect to a stationary object to provide image contrast between differently oriented structures in that object. Some embodiments of the present disclosure involve orienting the B0 imaging field at an angle, $\theta$, relative to such structures. This angle may be selected to reduce the $3\cos^2\theta-1$ term, for example to minimise it to increase the transverse relaxation time, T2, of the structure.

These methods may also involve using orientation data describing the orientation of the magnet assemblies with respect to a support or rotational coupling on which the magnet assemblies can be rotated to combine images acquired at different orientations to provide a composite image. Magic angle effects cause localised orientation sensitive dependent changes in signal intensity which may inhibit accurate co-registration of images acquired at differing orientations, and these effects present a challenge for conventional image co-registration techniques. It has therefore been thought of as inappropriate to combine images acquired with different B0 field orientations.

Examples of the present disclosure however exploit these differences in contrast, and by enabling the direction of the magnetic field to be manipulated in a reliable and measured way permit such images to be combined to provide information about the orientation of structures in an object.

For example a first MRI image of an object can be obtained based on a B0 imaging field, the orientation of the B0 imaging field with respect to the object can then be changed before a second MRI image of the object is obtained. This can enable the orientation of a structure within the object to be determined based on the orientations of the B0 imaging field with respect to the object and the image intensity associated with the structure in the first MRI image and the second MRI image.

A relationship can be estimated between the orientation of the B0 imaging field and the image intensity associated with a structure in an image. Based on this relationship, the orientation of the structure can be determined. This relationship may be estimated based on fitting, to the image intensity measurements acquired at different orientations, a function comprising a model of magic angle effects, for example a term which varies as $3\cos^2\theta-1$, where $\theta$ is an angle that the structure makes with the magnetic field B0. For example this may be accomplished using an algorithm such as that discussed in "An Algorithm for the Calculation of Three-Dimensional Collagen Fibre Orientation in Ligaments using Angle-Sensitive MRI" by Thomas Seidel et al. Mag. Res. Med 69:1595-1602 (2013). Examples of imaging methods which may be useful with the present disclosure may be provided by "Angle-Sensitive MRI for Quantitative Analysis of Fiber-Network Deformations in Compressed Cartilage" Garnov et al. Mag. Res. Med 70:225-231 (2013). A priori knowledge of the angle, $\theta$, for example based on anatomical data and/or the position of the human or animal subject (or tissue sample) being imaged, may be used in this fitting procedure to enable a small number of images (e.g. at least two) to be used for this purpose.

Where the magnet assemblies of the imaging apparatus provide a transverse B0 imaging field the relative orientation of the object and the B0 imaging field may be changed more easily, and to be more accurately and stably controlled. For example the magnet assemblies of the imaging apparatus can be rotated with respect to the object to be imaged which may remain stationary, for example the object may remain stationary with respect to a support or rotational coupling of the imaging apparatus upon which the magnet assemblies are rotated. As another example, the object to be imaged can be rotated with respect to the magnet assemblies. The use of transverse field enables a structure to be imaged in a greater range of orientations with respect to the B0 imaging field than might, for example, be achievable in axial field systems.

The object to be imaged may be stabilised by, for example secured to, a support, and the magnetic field can be rotated with respect to this support while the support remains stationary, thereby reducing the possible motion artefacts and other problems which may be associated with trying to reposition an object to be imaged within the confined space of an axial field magnet system.

A signal indicating the orientation of the B0 imaging field associated with each of at least two MRI images can be obtained, and this signal can be used to combine the images acquired at these different field orientations to provide a composite image. This signal may be obtained from an orientation sensor, for example an encoder, configured to sense the rotational position of the magnet assemblies and/or the rotational position of the object for example by sensing the orientation of the support on which the object is stabilised. This orientation signal can be used to co-register the images. In an embodiment the orientation signal is used to select adjustments to the gradients used in the imaging sequence.

To put these methods into context, the following disclosure introduces one apparatus in which they may be used. This apparatus happens to employ a transverse field configuration, and this is advantageous but other configurations, for example axial field configurations, may also be used.

FIG. 1 shows a very schematic view of a transverse field MRI apparatus 10 comprising a rotatable mounting 12, a first magnet assembly 14 and a second magnet assembly. The two magnet assemblies are spaced apart, to provide space for an imaging region 22 between them. The direction of separation of the magnet assemblies may be referred to as the axial direction because it generally corresponds to the direction of net magnetisation of the north and south poles of the two assemblies.

In the apparatus 10 illustrated in FIG. 1, each magnet assembly comprises a north pole 20, 20' and a south pole 18, 18' carried on a planar yoke 16, 16'. The net magnetisation of the north pole 20, 20' is directed away from the yoke 16, 16' on which it is carried, and the net magnetisation of the south pole 18, 18' is directed towards the yoke 16, 16'. Thus, each yoke 16, 16' guides magnetic flux from the rear face of its south pole to the rear face of its north pole which significantly improves the efficiency of the magnetic circuit and hence the net magnetic field obtained. The magnetic field of course also extends through the space on the other side of the two poles from the yoke 16, 16', and in this space the field has a component approximately parallel to the yoke 16, 16', for example transverse to the net magnetisation of the two poles. Each of the two magnet assemblies are similar, and arranged so that the yokes 16, 16' are outermost. The south poles 18, 18' of the two magnet assemblies are arranged towards one end of the apparatus 10, and the north poles of the two magnet assemblies are arranged towards the other end of the apparatus 10. In this configuration, the transverse magnetic field between the two assemblies is added together in the space between them. By selecting the relative strengths and shapes of the north and south poles 18, 18' of the two magnet assemblies, the field between the two can be made sufficiently homogeneous to provide a B0 field for performing magnetic resonance imaging in a region between the two magnet assemblies. Additional passive or dynamic shimming elements may be used in combination with the magnet assemblies to improve the homogeneity of the B0 field. Some optional refinements of the structure of the magnet assemblies are described below with reference to FIG. 4, FIG. 5, and FIG. 6.

The yokes 16, 16' of the two magnet assemblies are mechanically coupled together, and held apart either side of the imaging region 22 by a rigid separator, which may comprise a rotatable mounting 12. The magnet assemblies are thus arranged to be rotated together about an axis aligned with their direction of separation, for example about the direction of separation of the two magnet assemblies, for example about the direction of the net magnetisation of each of the north and south poles 18, 18'. This permits rotation of the B0 imaging field provided by the magnet assemblies with respect to the imaging region 22. In some embodiments the axis about which the magnet assemblies are to be rotated may be aligned with the centre for the magnet assemblies, for example the axis may pass through the isocenter of the imaging region. Advantageously, the use of separate yokes 16, 16' on either side of the imaging region means that an object, such as a limb or body of a patient, which extends out of the imaging region 22, can remain stationary while the field is rotated.

It will be appreciated that, although not shown in the drawings in the interests of clarity, gradient coils, and an RF transmit/receive coil may also be coupled to the apparatus 10 shown in FIG. 1 to permit MRI images to be collected from an object in the imaging region 22.

In operation, an object to be imaged is positioned in the imaging region 22, where it can be stabilised, for example by being rested on a support, or strapped or otherwise secured in place. This may secure the object in a fixed orientation with respect to the apparatus so that the magnet assemblies can be rotated on their rotatable mounting with respect to the apparatus 10, whilst the object remains in a fixed orientation with respect to the apparatus 10. FIG. 3A and FIG. 3B show perspective views of a person extending a limb into an imaging region 22 of the apparatus of FIG. 2. It can be seen from FIG. 3A and FIG. 3B, that the patient may be able to remain stationary, for example in a comfortable seated position with their limb supported comfortably while the magnet assemblies, and the B0 field are reoriented around them.

For example, the magnet assemblies can be rotated on the rotatable mounting 12 to select the orientation of the B0 field with respect to the object to be imaged while the object remains stationary. With the field in an initial orientation, an MRI image can be acquired. Once this first image has been acquired, the magnet assemblies are rotated about the stationary object to change the orientation of the B0 imaging field in the imaging region 22 with respect to that stationary object. A second MRI image of the object can then be acquired, and the two images can be combined to provide a composite image.

Figure 2:
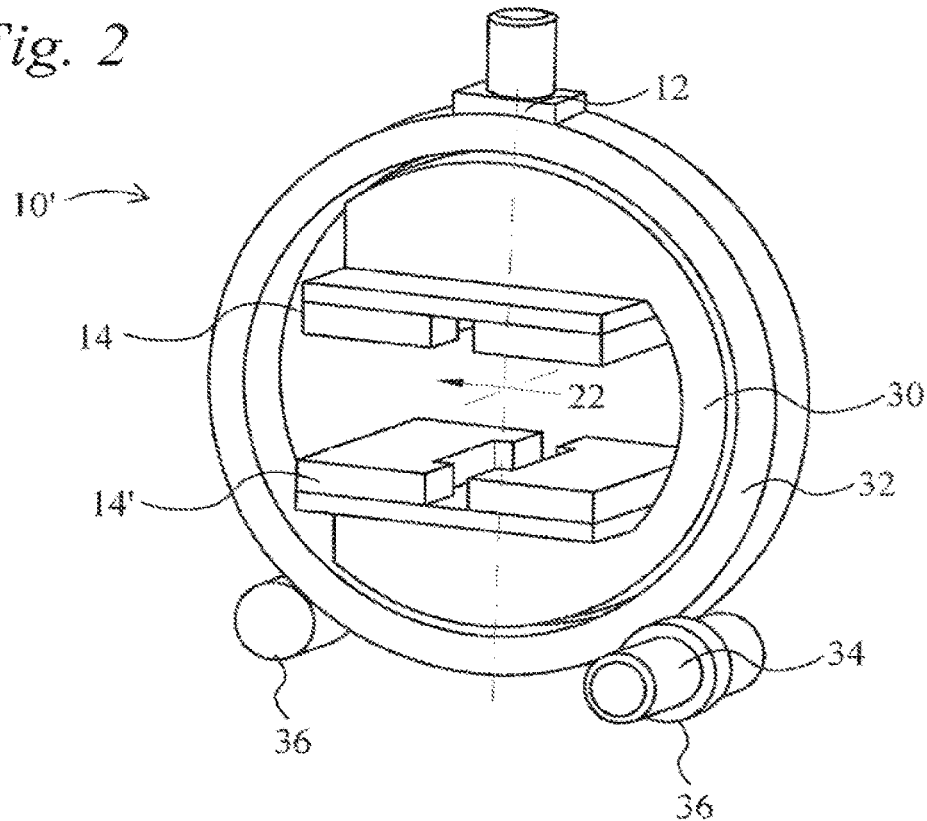
FIG. 2 shows an elevation view of a magnet assembly carried on a rotatable mounting
Figure 3A:
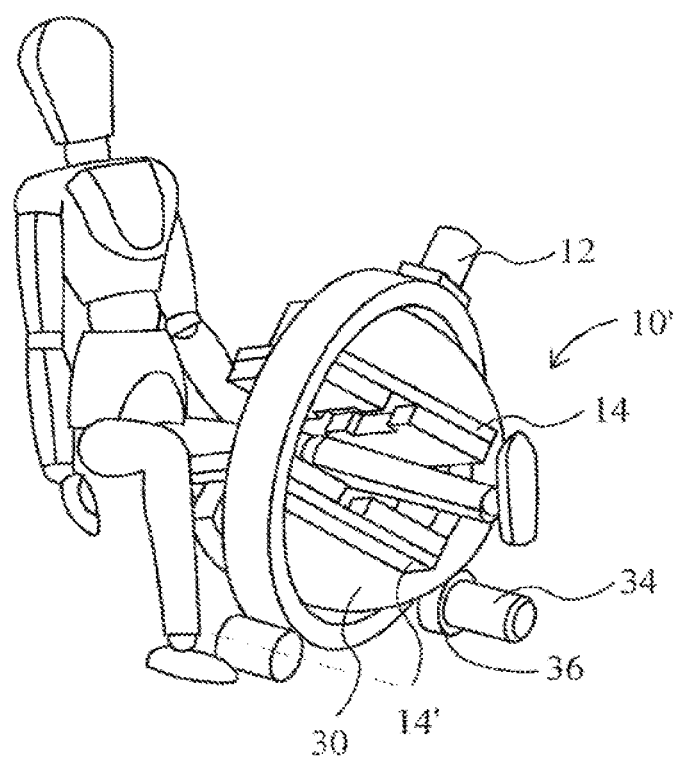
FIG. 3A shows an elevation view of the apparatus of FIG. 2 and a person extending a limb into an imaging region of the apparatus.
Figure 3B:
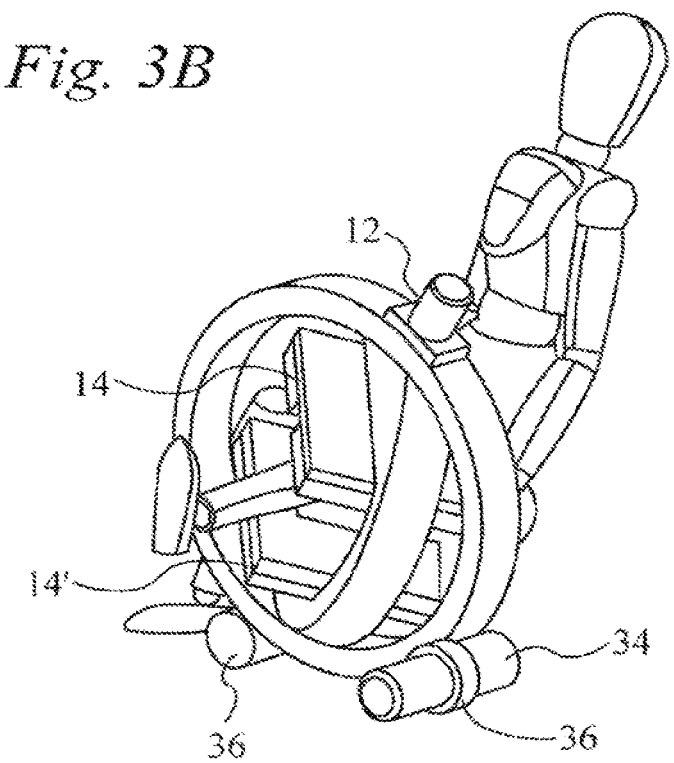
FIG. 3b shows a second elevation view of the apparatus of FIG. 2 from a different perspective from that shown in FIG. 3A.

FIG. 2 shows a perspective view of a transverse field MRI apparatus 10'. The apparatus shown in FIG. 2 comprises two magnet assemblies 14, 14' held apart from one another by a rigid separator 30. The separator shown in FIG. 2 comprises a C-shaped frame member that is arranged inside a circular frame 32, and coupled to that frame by a first rotatable mounting 12. The frame is itself carried on a support 36 by a second rotatable mounting 32. An imaging region 22 is provided in the space between the magnet assemblies 14, 14'.

The assemblies 14, 14' are arranged to provide, in this imaging region 22, a B0 imaging field transverse to their direction of separation.

The first rotatable mounting 12 enables the separator 30 to rotate with respect to the frame 32 about an axis in the plane of the frame 32, for example about an axis aligned with the direction of separation of the magnet assemblies (e.g. the axial direction). The second rotatable mounting 34 is configured to enable the frame to be rotated about an axis perpendicular to the plane of the frame 32. It can therefore be seen that, the separator 30 and frame 32 in the apparatus of FIG. 2 are arranged to provide a gimbal, and that by rotating the frame 32 with respect to its support 36, and rotating the separator 30 with respect to the frame 32, the orientation of the B0 filed can be rotated about two orthogonal axes. This enables the orientation of the B0 imaging field to be selected without the need to move the object that is to be imaged, for example a patient's limb, or other extended object, may be arranged partially inside the imaging region 22 whilst also extending out of it. The ability to rotate the B0 field about an axis aligned with the direction of separation of the magnet assemblies, and also to rotate that direction of separation, may enable almost any orientation of B0 field to be provided.

In operation, an object to be imaged can be arranged in the imaging region 22. Where the object to be imaged is a limb of a living human or animal body, unwanted movement of the limb during imaging can be reduced by supporting the limb in a position that is comfortable for the patient. The limb, or other object, may then be immobilised by securing it in place with respect to the imaging apparatus 10', for example by securing it with respect to the support 36 of the apparatus 10'. The magnet assemblies 14, 14' are then rotated together about at least one axis. This rotation may be selected to align the B0 field based on knowledge of the anatomy, or other internal structure, of the object. For example, the orientation of the B0 imaging field may be selected based on the orientation of a structure such as a tendon, ligament, or muscle in the object. For example, the orientation of the B0 imaging field may be selected based on the orientation of the structure and the magic angle—for example the B0 imaging field may be arranged to be at about 0° or about 55°, to the structure. An MRI image can then be obtained based on the B0 imaging field in that orientation. The orientation of the field can be changed whilst the object remains stationary on the support, and a second image can then be obtained. For example, the magnet assemblies can be moved so that the B0 imaging field is oriented at a selected angle relative to an assumed direction of the structure. This angle may be selected to reduce the $3\cos 2\theta - 1$ term, e.g. about 0° or about 55°, so as to increase the transverse relaxation time, T2, of the structure.

In some embodiments, the apparatus may comprise an orientation sensor arranged to determine the orientation of the B0 imaging field with respect to the imaging region 22. The orientation sensor may comprise a transducer configured to provide a signal based on the rotational position of at least one of the magnet assemblies, for example an orientation sensor may be coupled to one or both of the rotatable mountings 12, 34. In these embodiments the method described above may comprise storing an association between an image and the orientation of the B0 field when the image was acquired.

In the apparatus illustrated in FIG. 1 (and FIG. 2, and FIG. 6), each magnet assembly is described as comprising a north pole and a south pole. It will however be appreciated that the terms "north" and "south" are simply used to indicate a difference in orientation of the net magnetisation associated with each pole.

These poles are described as being carried on a planar yoke 16, 16', the yoke 16, 16' of course need not be planar and may for example carry curved, stepped, polygonal or indented surfaces. The shape of each yoke 16, 16' itself may be selected to shim, shape, or adjust the B0 imaging field, or to contain the field. Generally, the yoke 16, 16' comprises a material with a high magnetic permeability, such as a ferrous material. In some embodiments the yoke 16, 16' may comprise a permanent magnet. It will however be appreciated that, generally, such materials tend to be relatively high density. Embodiments of the disclosure however permit each magnet assembly to be carried on a separate yoke 16, 16', and the two magnet assemblies to be held spaced apart from one another by a rigid separator which may comprise a lighter (less dense) material which may also have a lower magnetic permeability because the arrangement of the magnet assemblies avoids, or reduces, the need to guide magnetic flux between the two magnet assemblies.

The arrangement shown in FIG. 2 comprises two magnet assemblies. However, in some configurations a single magnet assembly may be used, and the imaging sequence, and/or the gradient coil design, and/or additional passive or dynamic shims may be used to provide an imaging region 22 where the B0 imaging field is sufficiently homogeneous to permit imaging. In some embodiments more than two magnet assemblies may be used, for example three or more magnet assemblies may be arranged to partially surround an imaging region 22 in a triangular, quadrilateral, or polygonal configuration. Other arrangements of magnet assemblies, having other geometries may also be used.

It will be appreciated therefore that the principles of the disclosure set out above are not specific to the nature of the magnet assemblies used to provide a transverse field in the imaging region 22. The inventors in the present case have however appreciated that particular types of magnet assembly have a number of practical advantages when employed in apparatus such as that described above with reference to FIG. 1, FIG. 2, and FIG. 3. One such magnet assembly will now be described with reference to FIG. 4. Such magnet assemblies may also be used in other kinds of imaging apparatus.

The magnetic elements which make up these magnet assemblies are arranged in an array, such as a grid. The orientation of their net magnetisation, their axial height relative to other elements of the array, and the axial extent of at least one of the magnetic elements may each be selected to reduce inhomogeneity of the B0 imaging field in an imaging region 22.

The rotatable mounting or mountings may be configured to enable rotation of the B0 imaging field about at least two mutually perpendicular axes, and the magnet assemblies may be coupled together so that the orientations of the two magnet assemblies are fixed to rotate together.

FIG. 4A illustrates a perspective view of two such magnet assemblies 14, 14', arranged for providing a transverse magnetic field. The illustration in FIG. 4A does not show any separator, frame, rotatable mounting or other accessories that may be used when these assemblies are used in an imaging system.

FIG. 4A comprises a three dimensional axis, X-Y-Z, illustrating a Cartesian co-ordinate system 100. The Z-axis of this coordinate system is aligned with the direction of separation of the two assemblies, and for convenience this co-ordinate system will be used in describing the magnet assembly.

In the coordinate system of FIG. 4A, two magnet assemblies 14, 14' are shown separated from each other in the Z-direction. This direction of separation of the two assemblies 14, 14' is referred to herein as the axial direction. The magnet assemblies are each arranged in separate ranges of Z position, and the X and Y extent of the two assemblies is the same. The assemblies 14, 14' are configured to cooperate to provide a net magnetic field in an imaging region 22 between them. The magnetic field is transverse to the direction of separation between the assemblies, e.g. its components in X and Y directions may be greater than its Z component in this region. Accordingly, the B0 imaging field can be aligned with the X-direction, perpendicular to the direction of separation of the assemblies.

Each magnet assembly comprises an array 200 of magnetic elements 202, 204, 206, that extends across the width of the assembly in the Y-direction, perpendicular to the direction of separation of the assemblies, and the direction of the transverse B0 imaging field. Each magnet assembly 14, 14' also comprises two end pieces 210, 210', 210'', 210''' which bound each end of the array in the X-direction, and extend across the width of the array in the Y-direction. These end pieces may be arranged to provide a majority of the contribution to the transverse B0 imaging field.

Each of the magnetic elements 202, 204, 206 also has an orientation, an axial height and an axial extent. The axial height may be defined, for example, as the Z-position of the magnetic element's surface that faces the other magnet assembly, for example the distance from the face of the magnetic element to a plane which bisects the imaging region equidistant from the two magnet assemblies. The axial extent may be defined, for example, as the length of the magnetic element in the direction of separation of the magnet assemblies. As explained in more detail below, the orientation, axial height, and axial extent of each of the magnetic elements may each be selected based on the desired contribution to the B0 imaging field in the imaging region 22.

The yoke 16, 16' of each magnet assembly may comprise a seat for each magnetic element, and the axial height of each seat, for example the extent to which it protrudes from or is recessed into the yoke 16, 16' can also be selected based on the desired contribution to the B0 imaging field. The seats may be arranged so that one or more of the magnetic elements may be recessed into the yoke more or less than at least one other of the magnetic elements.

Figure 4B:
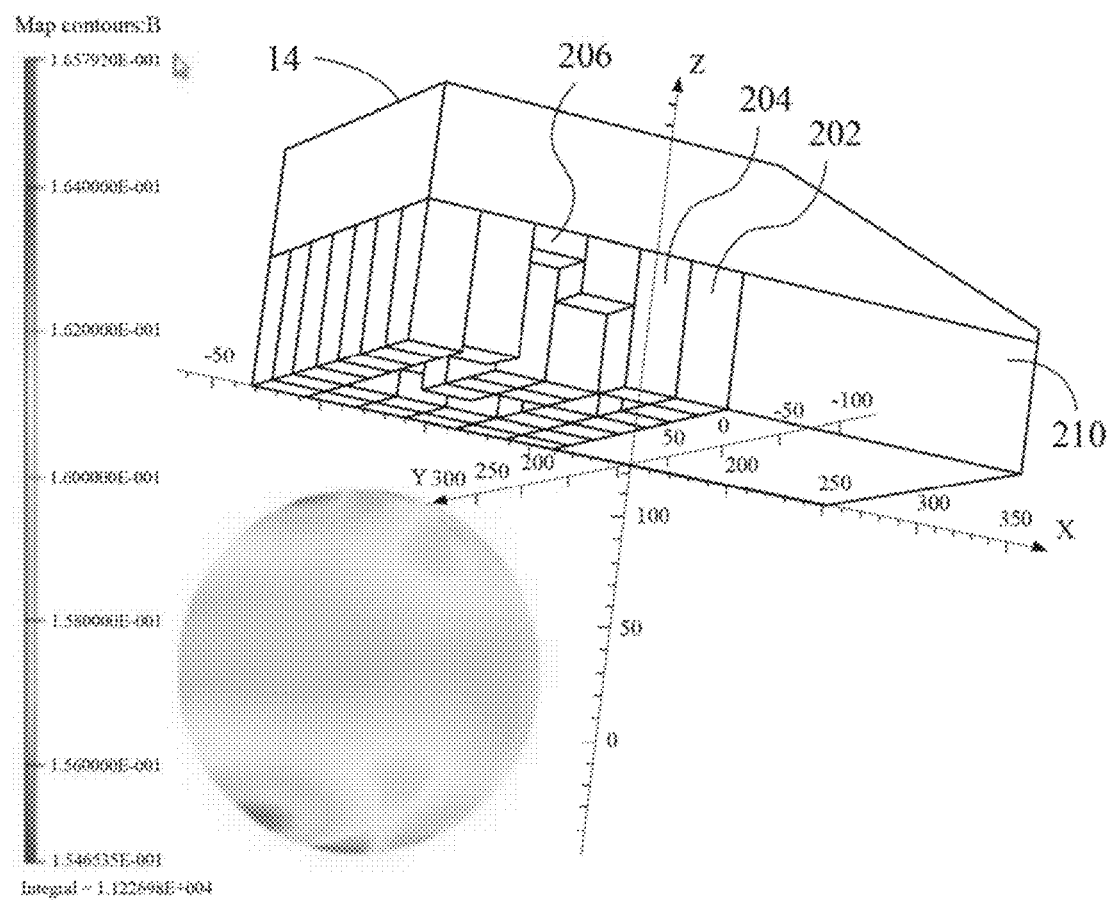
FIG. 4B shows a perspective view of an array of magnetic elements carried on a yoke, and an illustration of a part of an imaging region associated with this array of magnetic elements, the perspective view of FIG. 4B is also superimposed on a set of 3D Cartesian axes.

FIG. 4B shows a single quadrant of a magnet assembly such as one of the two magnet assemblies 14 shown in FIG. 4A. The quadrant illustrated in FIG. 4B may be located in the positive octant of Cartesian space defined by the coordinate system of the MRI system in which the magnet assembly is to be used. In some embodiments the configuration of the other three quadrants of the magnet assembly may be selected based on mirror reflections of the configuration of that quadrant. It can be seen that at least some of the magnetic elements in FIG. 4B may have different axial heights. FIG. 4B also illustrates a sphere in the general vicinity of an imaging region 22.

Figure 4C:
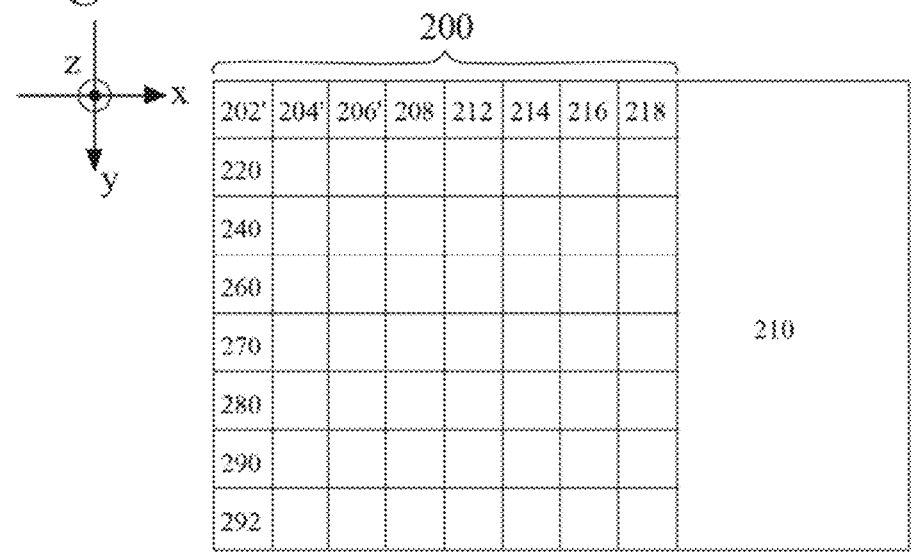
FIG. 4C shows a plan view of the array of magnetic elements illustrated in FIG. 4B.

FIG. 4C shows a plan view of an array of magnetic elements which abut an end piece 210 for a quadrant of a magnet assembly such as that illustrated in FIG. 4B. In the arrangement shown in FIG. 4B the array comprises a grid comprising a plurality of rows 202', 220, 240, 260, 270, 280, 290, 292, and each of these rows may itself comprise a plurality of magnetic elements 204', 206', 208, 212, 214, 216, 218. As illustrated, the magnetic elements may be arranged to about one another, or a spacing may be provided between them.

It will be appreciated in the context of the present disclosure that the magnetic field associated with the array of magnetic elements may be provided by a linear sum of the contribution from each of the magnetic elements, and that this can provide a numerical model of the magnetic field at a plurality of locations in the imaging region 22 between the two assemblies.

To design the magnet assemblies a numerical function is obtained which defines the contribution bi(rj) of each of the magnetic elements i to the magnetic field at a plurality of locations j in the imaging region 22 as a function of the position of each magnetic element, and the magnitude and orientation of its magnetisation. This may be written:

$$b_i(r_j)=f(r_{ij}, m_i) \qquad \text{(Equation 1)}$$

Where rij indicates the distance from the location of the ith magnetic element to the location rj. A merit function can then be defined based on the difference between the sum of these contributions, and the desired B0 imaging field imaging field, $B_{target}$, at a plurality of spatial locations, $r_j$, in the imaging region 22. Once such merit function may be written:

$$E=\Sigma_j |B_{target}(r_j) - \Sigma_i b_i(r_j)|^2 \qquad \text{(Equation 2)}$$

The position, magnitude and orientation of the magnetisation of a magnetic element may in turn be defined by parameters which depend on the nature of the magnetic element concerned. For example, where the magnetic elements comprise permanent magnets the magnetic moment of each element depends upon its magnetic moment per unit volume, the orientation of that magnetic moment, and its volume. The inventors in the present case have appreciated that this may present an intractable computational problem. However, they have further appreciated that by initially constraining the array of magnetic elements to be arranged in a rectangular array of elements, the axial height, axial extent, and orientation of these magnetic elements can be optimised in this numerical model to find arrangements of magnetic elements which provide the desired target field.

Figure 5:
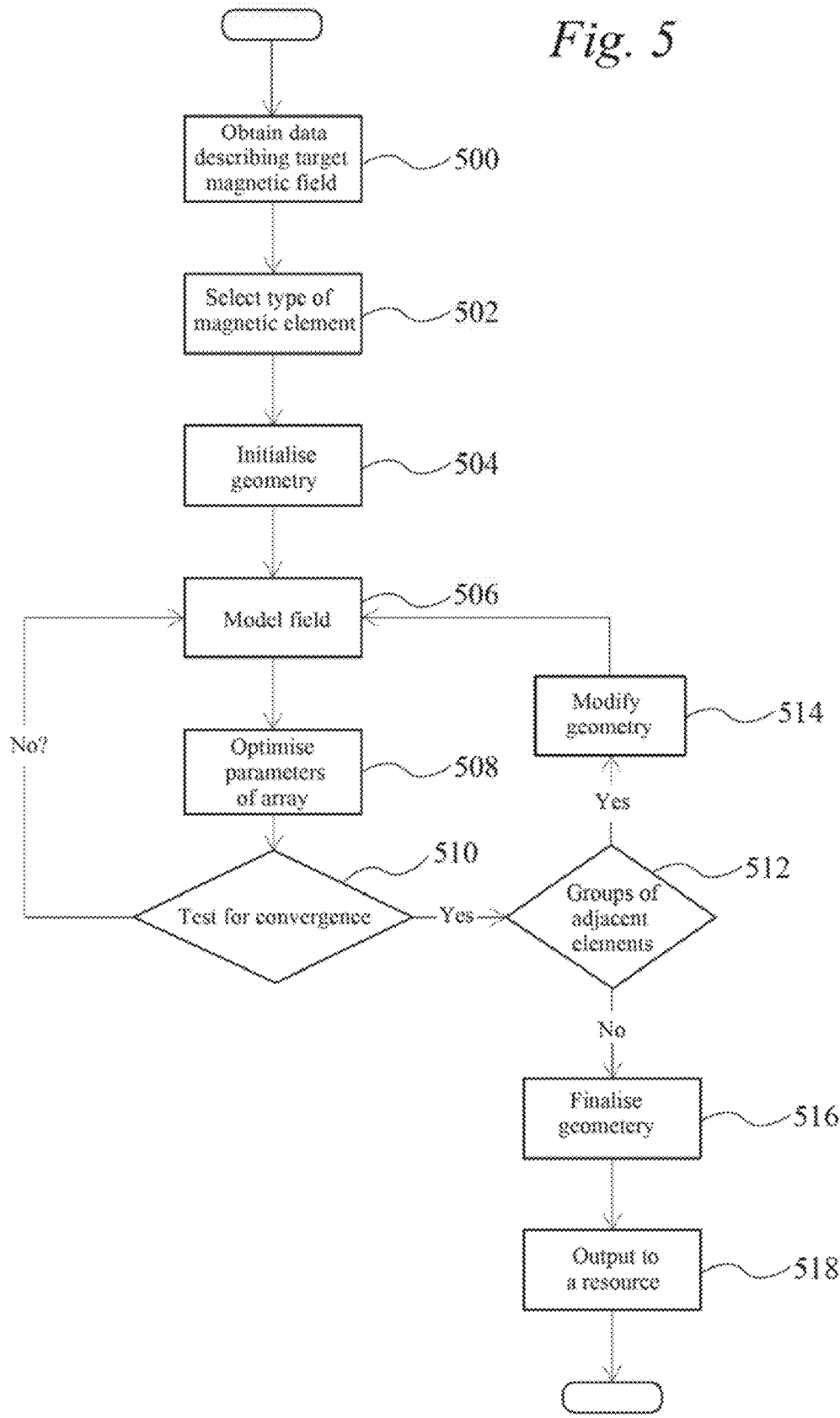
FIG. 5 shows a flow chart illustrating a computer implemented method of designing a magnet assembly.

FIG. 5 shows a flow chart illustrating a computer implemented method of designing a magnet assembly comprising an array of magnetic elements. In the process illustrated in FIG. 5, the computer first obtains 500 data describing the target magnetic field in the imaging region 22 at a plurality of locations rj.

A type of magnetic element is selected 502, and the computer obtains a model of the magnetisation associated with the magnetic element as a function of its geometry. For example, where the magnetic element is a permanent magnet the model of the magnetic element may comprise the magnetisation per unit volume of the magnetic element.

The computer then initialises 504 a set of geometry data describing an initial arrangement of magnetic elements. For example, this initial geometry may comprise an array such as a grid of magnetic elements each of which may be characterised by parameters including axial height, orientation, axial extent, and transverse extent (e.g. the width or area that it occupies in the plane of the array). Where the transverse extent of a magnetic element is increased as part of this process, the transverse extent of one or more neighbouring elements may be reduced to accommodate the change.

The computer then models 506 the magnetic field at the plurality of locations rj in the imaging region 22 based on the sum of contributions, bi, to the field from the magnetisation mi of each magnetic element, and optimises 508 the parameters of the array of magnetic elements based on the target magnetic field data and the contributions from each magnetic element using a merit function such as that defined in Equation 2, above.

In practice each magnetic element may also influence the magnetisation in the yokes 16, 16' also which in turn influences the magnetic field at point rj. The computer may be configured to take this effect into account by modelling and calibrating the effect of each element together with its induced effect on the yoke. This can be achieved for example by finite-element modelling of the magnetic system. These calibrations may modify the function f in Equation 1, above, and the computer may be configured to update this function for each element during the optimisation.

Once the computer has determined 510 that the magnetic field provided by the sum of contributions from the magnetic elements is equal to the target magnetic field to within a selected tolerance, the computer examines the array defined by the result of the optimisation and identifies 512 whether any groups of adjacent magnetic elements have magnetisation that shares a common orientation. In the event that the magnetisations of a group of adjacent magnetic elements do have a common orientation, the computer can modify 514 the geometry of the array so that each of these groups is replaced by a single magnetic element having a shape selected based on the geometry of that group. This may result in an array geometry which comprises irregular array elements, for example non-rectangular array elements, such as polyform shaped elements. Grouping the elements in this way may enable the array of elements to be manufactured more easily and more accurately.

The computer then determines 506 the magnetic field at the plurality of locations rj in the imaging region 22 based on the sum of contributions, bi, to the field from the magnetisation mi of each magnetic element in the modified array geometry. Where the modified array geometry includes irregular array elements, such as polyform array elements, these magnetic elements may be characterised in the optimisation by additional parameters, indicating, for example whether one or more surfaces of the magnetic element may comprise a sloping surface, a curved surface, a continuous flat surface, or a stepped surface associated with the polyform element obtained by grouping adjacent elements of an array such as a grid. The computer then optimises 508 the parameters of the array of magnetic elements based on the target magnetic field data and the contributions from each magnetic element using a merit function such as that defined in Equation 2, above. If the computer determines 510 that this optimisation has converged, the computer may examine the array again to identify 512 whether any more groups of adjacent magnetic elements have magnetisation with a common orientation.

If no additional groups are identified, the geometry of the computer stores 516 the final geometry into memory, and may output 518 the final geometry to a resource such as a manufacturing tool adapted for the construction of the array of magnetic elements.

Where an apparatus comprises two magnet assemblies arranged either side of an imaging region 22, such as the apparatus described above with reference to FIG. 1, or FIG. 2, each quadrant of each magnet assembly may be considered an octant of the apparatus as a whole. In this configuration, the apparatus has three planes of symmetry with magnetic boundary conditions imposed such that the magnetic field is parallel to the symmetry planes Z=0 and Y=0 and normal to the symmetry plane X=0 the three planes, X-Y, Y-Z, and Z-X, which meet at the centre of the imaging region 22 as illustrated in FIG. 4A. As will be appreciated in the context of the present disclosure, this symmetry condition ensures that only the array of magnetic elements in a first octant of the apparatus needs to be considered as variables. The method described above may therefore be applied to a single quadrant of a single magnet assembly, and the symmetrical nature of the magnetic field contributions can then be exploited to provide an array of magnetic elements which span the other three quadrants of that magnet assembly, and the four quadrants of the other magnet assembly of the apparatus.

Therefore, once the arrangement of an array has been selected for a first quadrant of one assembly, the computer can select an arrangement of an array for a second quadrant to provide a spatial mirror image of the first array. The computer can then determine the spatial arrangement of each quadrant of each assembly (each octant of the apparatus as a whole) by reflecting the spatial arrangement of the first octant in the three planes, X-Y, Y-Z, and Z-X, which meet at the centre of the imaging region 22 as illustrated in FIG. 4A. In addition to providing a spatial mirror image, the magnetisations of the magnetic elements are selected based on the magnetisations of the magnetic elements determined for the first quadrant as defined by the transformations set out in Table 1.

TABLE 1

Orientation of Components of Magnetization vector ($M_X$, MY, MZ) Relative to First Octant

| Magnetization Component | Octant | | | | | | | |
|---|---|---|---|---|---|---|---|---|
| | 1 | 2 | 3 | 4 | 5 | 6 | 7 | 8 |
| MX | +1 | +1 | +1 | +1 | +1 | +1 | +1 | +1 |
| MY | +1 | −1 | +1 | −1 | +1 | −1 | +1 | −1 |
| MZ | +1 | −1 | −1 | +1 | −1 | +1 | +1 | −1 |

Where the octants indicated in Table 1 are defined spatially with reference to the axes in FIG. 1 as indicated in Table 2.

TABLE 2

Definition of Octants

| coordinate | Octant | | | | | | | |
|---|---|---|---|---|---|---|---|---|
| | 1 | 2 | 3 | 4 | 5 | 6 | 7 | 8 |
| X | + | − | − | + | + | − | − | + |
| Y | + | + | − | − | + | + | − | − |
| Z | + | + | + | + | − | − | − | − |

The optimisation described above for the first octant has been described with reference to particular parameters of the magnetic elements, and these parameters may be of particular utility where the magnetic elements comprise permanent magnets. It may also be possible to select the magnitude of the net magnetisation of each magnetic element. In addition the orientation may be defined in a simple binary fashion, for example the orientation may be either aligned with the direction of separation of the two magnet assemblies (e.g. axially), or aligned against that direction. In some cases however the orientation of one or more of the magnetic elements may have a transverse component, and the parameter used in the optimisation may comprise the angle between the magnetisation. The steps in this angle parameter may have a resolution of less than 180°, for example a resolution of 90, for example 60°, for example 30°.

The embodiments described above may have particular utility in the construction of permanent magnet imaging systems. However, in some embodiments, the magnet assemblies described above may comprise magnetic elements which have at least partial electromagnetic components such as ohmic or super conducting components. For example, where the magnetic element is an ohmic electromagnet, or a superconducting electromagnet the model of the magnetic element may comprise the number of ampere turns of current carrying conductor, and their cross section.

The array of magnetic elements may comprise a grid, which for example may comprise a rectilinear grid, for example a curvilinear grid. The initial grid used as a starting point for the optimisation described above may comprise an array of magnetic elements each having the same transverse extent, for example occupying the same area in the array. The array may be arranged so that adjacent elements of the array abut one another or are spaced apart by a selected spacing distance. The spacing between one or more adjacent elements of the array may be selected based on an optimisation such as that described above with reference to FIG. 5.

In an embodiment the disclosure provides an array portion of an array of magnetic elements for providing a contribution to a transverse B0 imaging field for a transverse field magnetic resonance imaging apparatus. The array portion may be arranged to provide one quadrant of an array that provides a transverse B0 imaging field parallel to the array. A transverse magnetic field imaging apparatus may comprise two such arrays, each arranged on a separate yoke 16, 16' and separated by a space in which the two assemblies provide a B0 imaging field. The direction of separation of these two magnet assemblies may be referred to as the axial direction. Where the arrays of magnetic elements are planar, then this direction may be perpendicular to the plane of the array.

Each array, for example an array portion, may comprise at least one magnetic element having a different orientation than at least one other magnetic element of that magnet assembly. An array portion may simply be a small array (i.e. the entire array may be referred to as an array portion, and vice versa) or it may be arranged to provide one quadrant of an array. Accordingly, each half of an array may comprise two such quadrants and each of these may be arranged as a mirror image of the other. Each half of the array as a whole may also be arranged as a mirror image of the other.

It is mentioned above with reference to FIG. 5 that in some embodiments groups of adjacent magnetic elements which share a common orientation can be replaced by a single magnetic element, for example a contiguous magnetic element, for example a single contiguous magnetic element having a shape selected based on the combined shape of the group of magnetic elements which it replaces. This is of course, optional, but where it is done the combined magnetic elements resulting from this grouping process may comprise a polyform shaped magnetic element, which may have a rectangular geometry, for example a square geometry.

Where the elements are grouped in this way, one or more outer surfaces of the combined element may comprise a stepped profile. The computer implemented method described above may comprise replacing a stepped surface with a curved or sloping surface whose shape is selected based on that stepped profile. Although the possibility of doing this by a further optimisation is mentioned above, it will be appreciated that such slanted and/or curving surfaces may be selected without a further optimisation, and may simply be selected to approximate the stepped profile with a continuous profile such as may be associated with a polynomial, a spline such as a B-spline, for example a non-uniform rational B-spline, a sinusoidal, or exponential function or any combination thereof. In any case, stepped surfaces may be replaced by curved or sloping surfaces which fit those stepped surfaces, for example to fit them in a least squares sense. It may not be necessary to re-estimate the magnetic field produced by a combined magnetic element in order to do this.

The yokes may comprise a material of relatively high magnetic permeability, for example a ferromagnetic material or ferrimagnetic material, for example a ferrous or ferrite material for example, soft iron, soft steel material, and/or ceramics derived from iron oxides such as hematite ($Fe_2O_3$) or magnetite ($Fe_3O_4$) and/or oxides of other metals. The separator may comprise a material that is of lower permeability than the yokes, for example materials such as aluminium, austenitic stainless steel, carbon fibre, and/or polymeric or other generally non-magnetic materials.

Where an orientation sensor is coupled to a rotational coupling this may comprise a position encoder. In some embodiments the rotational coupling also comprises an actuator such as a mechanical mover, such as a motor. In these embodiments a controller may be provided to control the actuator in response to an operator's command, and the controller may be configured to compare a signal from the orientation sensor with the expected position of the rotational coupling (e.g. the expected position based on the operator's command). The controller may be configured to trigger an alert, for example to inhibit use of an imaging apparatus in the event that the orientation sensor signal does not match with the expected position.

Some embodiments of the disclosure may comprise an eddy current inhibitor, adapted to inhibit the generation of eddy currents in the yoke 16, 16' of the magnet assemblies, for example configured to inhibit eddy currents generated by gradient coils of an MRI imaging system which is used with the magnet assembly. The eddy current inhibitor may be arranged between a magnet assembly and the yoke to which it is secured.

One such eddy current inhibitor comprises electrical insulator which insulates some regions of the surface of the yoke from other regions, for example the insulator may be interspersed with the material of the yoke to provide a tiled and/or laminated layer, in some embodiments the eddy current inhibitor may comprise a layer of powdered iron or other ferrous material. This layer may be arranged adjacent to the surface of the yoke between the yoke and the magnet assemblies that are carried by the yoke.

References to magnetic elements, arrays of such elements, and their surfaces, shapes, and geometries, and the magnetic fields associated with them may apply to either modelled data or physical apparatus.

FIG. 6 shows an MRI apparatus 10 comprising a controller 500, two magnet assemblies 14, 14' each carried on separate yokes 16, 16', and gradient windings 17 arranged for providing magnetic field gradients for imaging in an imaging region between the two magnet assemblies 14, 14'. The magnet assemblies 14, 14' are coupled to a support 36 by a rotatable mounting 12.

An orientation sensor 502 is coupled to the rotatable mounting 12 and to the controller 500.

The controller 500 comprises a data store, and an imaging interface 506 for using the MRI apparatus 10 to obtain magnetic resonance images. As will be appreciated, other than as discussed below with reference to FIG. 4 and FIG. 5 the nature of the imaging sequences, and the control of the RF excitation signals, and the RF receiver are not relevant to the present disclosure and so have been omitted from the discussion presented here in the interests of clarity.

The two magnet assemblies 14, 14' are spaced apart and mechanically coupled together by a rigid separator (not shown in FIG. 6) to provide space for an imaging region 22 between them. As illustrated in FIG. 1 the gradient windings 17 are carried on the faces of the two magnet assemblies 14, 14' adjacent to the imaging region 22. The gradient windings 17 are coupled to the controller 500 for receiving a supply of electrical current to drive the gradients. The imaging interface is operable to control the current provided to the gradient windings 17.

The orientation sensor 502 is operable to sense the orientation of the magnet assemblies 14, 14' with respect to the support 36 upon which the magnet assemblies are carried by the rotatable mounting 12. The orientation sensor 502 is also configured to provide an orientation signal indicating the orientation of the magnet assemblies 14, 14' with respect to the support 12 to the controller 500.

The direction of separation of the magnet assemblies 14, 14' may be referred to as the axial direction because it generally corresponds to the direction of net magnetisation of the north and south poles of the two assemblies. In the apparatus 10 illustrated in FIG. 6, each magnet assembly comprises a north pole 20, 20' and a south pole 18, 18' carried on a planar yoke 16, 16'. The net magnetisation of the north pole 20, 20' is directed away from the yoke 16, 16' on which it is carried, and the net magnetisation of the south pole 18, 18' is directed towards the yoke 16, 16'. Thus, each yoke 16, 16' guides magnetic flux from the rear face of its south pole to the rear face of its north pole which significantly improves the efficiency of the magnetic circuit and hence the net magnetic field obtained. The magnetic field of course also extends through the space on the other side of the two poles from the yoke 16, 16', and in this space the field has a component approximately parallel to the yoke 16, 16', for example transverse to the net magnetisation of the two poles. Each of the two magnet assemblies are similar, and arranged so that the yokes 16, 16' are outermost. The south poles 18, 18' of the two magnet assemblies are arranged towards one end of the apparatus 10, and the north poles of the two magnet assemblies are arranged towards the other end of the apparatus 10. In this configuration, the transverse magnetic field between the two assemblies is added together in the space between them. By selecting the relative strengths and shapes of the north and south poles 18, 18' of the two magnet assemblies, the field between the two can be made sufficiently homogeneous to provide a B0 field for performing magnetic resonance imaging in a region between the two magnet assemblies. Additional passive or dynamic shimming elements may be used in combination with the magnet assemblies to improve the homogeneity of the B0 field. The yokes 16, 16' of the two magnet assemblies may be mechanically coupled together, and held apart either side of the imaging region 22 by a rigid separator, which may comprise a rotatable mounting 12. The magnet assemblies can thus be arranged to be rotated together about an axis aligned with their direction of separation, for example about the direction of separation of the two magnet assemblies, for example about the direction of the net magnetisation of each of the north and south poles 18, 18'. This permits rotation of the B0 imaging field provided by the magnet assemblies with respect to the imaging region 22. Advantageously, the use of separate yokes 16, 16' on either side of the imaging region 22 means that an object, such as a limb or body of a patient, which extends out of the imaging region 22, can remain stationary while the field is rotated.

It will be appreciated that, although not shown in the drawings in the interests of clarity, an RF transmit/receive coil may also be coupled to the controller 500 and arranged in the imaging region 22 of the apparatus 10 shown in FIG. 6 to permit magnetic resonance images to be collected from an object in the imaging region 22.

The poles of the magnet assemblies may comprise ohmic or superconducting coils generating the same magnetic dipole moments where north-south polarity is replaced by current polarity. A superconducting coils system may be useful if B0 fields greater than approximately 0.25 Tesla are required.

The magnet assemblies, yokes, and rotatable mountings described above with reference to FIG. 6 may be arranged as illustrated in FIG. 2 and as described herein with reference to that drawing. Embodiments of this apparatus may also be used as described with reference to FIG. 3A and FIG. 3B.

Referring back now to FIG. 3A and FIG. 3B, it can be seen that FIG. 3A and FIG. 3B show perspective views of a person extending a limb into an imaging region 22 of the apparatus of FIG. 2. Three modes of operation of the apparatus illustrated in FIG. 6 will now be described with reference to the apparatus shown in FIG. 3A and FIG. 3B and the flow diagrams illustrated in FIG. 7 FIG. 8 and FIG. 9.

In operation of the apparatus described with reference to FIG. 6 an object to be imaged is positioned in the imaging region 22, where it can be stabilised, for example by being rested on a support, or strapped or otherwise secured in place. This may secure the object in a fixed orientation with respect to the apparatus (e.g. with respect to the support 36 of the apparatus) so that the magnet assemblies 14, 14' can be rotated on their rotatable mounting 12 whilst the object remains in a fixed orientation.

It can be seen from FIG. 3A and FIG. 3B, that the patient may be able to remain stationary, for example in a seated position with their limb supported comfortably while the magnet assemblies 14, 14', and the B0 imaging field are reoriented around them. For example, the magnet assemblies can be rotated on the rotatable mounting 12 to select the orientation of the B0 field with respect to the object to be imaged while the object remains stationary. With the field in an initial orientation, an MRI image can be acquired. Once this first image has been acquired, the magnet assemblies are rotated about the stationary object to change the orientation of the B0 imaging field in the imaging region 22 with respect to that stationary object. A second MRI image of the object can then be acquired, and the two images can be combined to provide a composite image as described below with reference to FIG. 7.

FIG. 7 shows a flow chart illustrating a method of determining an orientation of a structure within such an object. The orientation of such a structure can be determined based on the orientations of the B0 imaging field with respect to the object, and the image intensity associated with the structure in at least two magnetic resonance images each acquired at different orientations of the B0 imaging field with respect to the object. A priori information about the known or likely orientation of the structure may also be used to constrain the fitting procedure. For example, the range of likely angles may be estimated based on anatomical data and/or based on the position of the human or animal subject or tissue sample being imaged.

As illustrated in FIG. 7, the method comprises obtaining 1000 an orientation signal indicating the orientation of the B0 imaging field with respect to the object, and obtaining a first magnetic resonance image of the object in that orientation.

The orientation of the B0 imaging field with respect to the object is then changed 1002, for example by rotating the magnet assemblies 14, 14' with respect to the support 36 to which the magnet assemblies are coupled by the rotatable mounting 12 illustrated in FIG. 1, or by rotating the object with respect to a transverse B0 imaging field.

Another orientation signal is then obtained 1004 indicating the orientation of the B0 imaging field with respect to the object, and a second magnetic resonance image of the object is obtained with the object in that orientation.

The first image and the second image are then combined 1006 based on the orientation signal, for example the images can be combined by being co-registered based on the orientation signal and the spatial distribution of image intensity in the two images. For example, an image transform, such as an affine transformation, may be determined based on the orientation signal obtained in the two orientations. This image transform can then be used to co-register the images. This may comprise using this transform alone or as a starting point for, or a verification check of, an image transform determined based on the spatial distribution of image intensity in the two images. For example the orientation signals may be used to define an initial rotation to be applied before attempting to coregister the images based on their pixel intensities. Image co-registration methods are known in the art, and it will be apparent in the context of the present disclosure that the orientation signal can be used in these methods in any of a variety of ways. Regardless of the method of co-registration used, one or both of the images can be transformed into a space in which corresponding locations in the two images both provide image data relating to the same location in the object.

To determine 1008 the orientation of a structure in the object, when the images have been co-registered, a relationship between the orientation of the B0 imaging field and the image intensity associated with each location in the two images can then be obtained. For example, the orientation may be determined based on fitting (e.g. in a least squares sense) a signal model to the signal intensity in the two images in corresponding voxels. As will be appreciated in the context of the present disclosure each voxel comprises a signal intensity of an area of the image associated with a corresponding volume element of the object. Accordingly, by using the signal intensity in corresponding voxels of the two images, and the orientation signals recorded with the two images, the controller 500 can estimate a relationship between the orientation of the B0 imaging field and the intensity of the signal in each voxel. Based on this relationship, the controller 500 can determine 1008 the orientation of a structure which occupies that volume element.

This relationship may be estimated based on fitting a function comprising a model of magic angle effects, such as for example a term which varies as $3\cos 2\theta - 1$, where $\theta$ is an angle that the structure makes with the B0 imaging field. This may comprise deriving the angle, $\theta$, from this fitting procedure and using this with the orientation signals to determine the orientation of structures in the object. The range of values, $\theta$, that are used in this fitting procedure may be selected (e.g. limited) based on a prior knowledge of the likely orientation of the structure. Other methods of determining the orientation may also be used. In some optional embodiments, the orientation data obtained in this way may be combined 1010 and/or displayed in combination with structural or anatomical images of the object to provide a map of the orientations of structures in an object.

A computer implemented method of calibrating the imaging apparatus of FIG. 6 will now be described with reference to FIG. 8.

In operation, the magnet assemblies are arranged in a first orientation and the controller 500 obtains 2000 an orientation signal from the orientation sensor 502. The magnetic field in the imaging region 22 is then measured 2002 to provide data describing an inhomogeneity in the field. Based on this data, the controller 500 then determines a magnetic field adjustment, for example a linearly varying (e.g. first order) magnetic field adjustment configured to improve the homogeneity (e.g. to "shim") the field in the imaging region 22 when the magnetic field assemblies are arranged in that particular orientation.

The controller 500 then stores data based on this magnetic field adjustment into the data store and stores 2006 an association between the magnetic field adjustment data and an orientation signal indicating the orientation of the magnet assemblies associated with that magnetic field adjustment. It is then determined 2008 whether the magnetic field adjustments for additional orientations need to be obtained, and in the event that they are, a new orientation is selected, and the orientation of the magnet assemblies with respect to the support is changed 2010, and the process 200, 2002, 2004, 2006, 2008 is repeated in the new orientation. In this way, a library of magnetic field adjustments can be provided in which each magnetic field adjustment is associated with a particular orientation. In this way a set of shims, or magnetic field adjustments, can be determined which each correspond to a particular orientation of the magnet assemblies with respect to the support 36 upon which the magnet assemblies are carried (or with respect to some other reference orientation).

In operation as the orientation of the magnet assemblies is changed, the B0 imaging field in the imaging region 22 rotates, but the magnetic environment around the apparatus remains stationary. This magnetic environment may interact with the magnetic field in the imaging region 22, accordingly the total magnetic field in the imaging region 22—the sum of the B0 field provided by the magnet assemblies and contributions to the field due to the magnetic environment— will differ according to the orientation of the magnet assemblies relative to this environment.

As explained above with reference to FIG. 8, when a system such as that calibrated according to the method illustrated in FIG. 7 is in operation, an object to be imaged can be positioned in the imaging region 22, where it can be stabilised, for example by being rested on a support, or strapped or otherwise secured in place. This may secure the object in a fixed orientation with respect to the apparatus so that the magnet assemblies can be rotated on their rotatable mounting with respect to the support of the apparatus 10, whilst the object remains in a fixed orientation with respect to the apparatus support.

As will be appreciated in the context of the present disclosure magnetic resonance imaging sequences typically comprise the application of time varying magnetic field gradients. The amplitude (e.g. change in magnetic field per unit length) and duration of these gradients determines the spatial encoding, for example phase encoding and/or frequency encoding, of the imaging sequence. Different imaging sequences are known in the art but regardless of the specific imaging sequence used, additional gradients associated with inhomogeneity in the magnetic field in the imaging region 22 can make unwanted contributions to the spatial encoding of the image.

FIG. 9 illustrates a flow chart showing one possible way to address this problem. In this method the controller 500 obtains 3000 an orientation signal from the orientation sensor 502, and selects 3002 a magnetic field adjustment based on this orientation signal, for example by using an association between the orientation signal and a stored magnetic field adjustment, which may be retrieved from the data store 504, and may have been predetermined and/or provided based on a calibration such as that described above with reference to FIG. 9.

The controller 500 then obtains an imaging sequence comprising a sequence of gradient signals to be applied to the gradient windings 17. To apply 3002 the magnetic field adjustment the controller modifies the amplitude and/or duration of at least one gradient of the imaging sequence based on the magnetic field adjustment. The controller 500 then obtains the magnetic resonance image using the modified imaging sequence.

It is then determined 3006 whether further magnetic resonance images are to be acquired at one or more different orientations, and in the event that they are, a new orientation is selected, and the orientation of the magnet assemblies with respect to the support is changed 3008. The controller 500 can then obtain 3000 a new orientation signal, select a new magnetic field adjustment based on this orientation signal 3002, make a new adjustment to the imaging sequence based on this and acquire 3004 a new image at the new orientation. Images acquired in this way can then be combined and used to determine the orientations of structures in the object as described above with reference to FIG. 4.

It will be appreciated that in addition to, or as an alternative to modifying the gradients used in the imaging sequence, the controller 500 may be configured to control magnetic shims, such as passive magnetic shims or active shims, to adjust the magnetic field in the imaging region 22 based on the orientation signal. In addition to linearly varying shims, second or higher order terms may also be compensated, for example by the use of electrical shim coils configured to provide second or higher order adjustments to the B0 imaging field.

Where a fitting procedure is used in determining a relationship between the signal intensity and the orientation of the B0 field with respect to the object this fitting procedure may comprise reducing the difference between a signal model (e.g. based on an analytic and/or numerical model of magic angle effects) and the measured signal intensity in images acquired at different orientations. Least squares fitting is mentioned above but any type of fitting procedure may be used.

The magnetic field adjustment may comprise an adjustment which varies linearly in space, for example a linear spatial function. In some embodiments higher order adjustments may be applied, and zero order, spatially homogeneous, adjustments may also be applied. These adjustments may be selected to reduce the differences in field inhomogeneity between the B0 imaging field provided in different orientations. In addition to, or as an alternative to, adjustment of gradient lobes of an imaging sequence, shim currents may be used to provide non-time varying adjustments to the B0 imaging field based on the orientation signal and/or calibration data obtained from the data store.

It will be appreciated therefore that the principles of the disclosure set out above are not specific to the nature of the magnet assemblies used to provide a transverse field in the imaging region 22. The inventors in the present case have however appreciated that particular types of magnet assembly have a number of practical advantages when employed in apparatus such as that described above with reference to FIG. 1, FIG. 2, and FIG. 3 and FIG. 6. In some embodiments these magnet assemblies comprise a plurality of magnet elements arranged in an array, such as a grid. The orientation of their net magnetisation, their axial height relative to other elements of the array, and the axial extent of at least one of the magnetic elements may each be selected to reduce inhomogeneity of the B0 imaging field in an imaging region 22. Each of the north poles 20, 20' and south poles 18, 18' may comprise such an array. In these arrays the majority of the magnetisation may be provided by a large magnetic element or end piece arranged towards one end of the magnet assembly, and an array of smaller elements having selected orientations, heights and sizes may be arranged to reduce the inhomogeneity of the B0 imaging field as described above. Other configurations of magnet assemblies may be used. For example, each magnet assembly may comprise an array 200 of magnetic elements that extend across the width of the assembly perpendicular to the direction of separation of the assemblies, and the direction of the transverse B0 imaging field. Each magnet assembly 14, 14' also comprises two end pieces which bound each end of the array and extend across the width of the array in the Y-direction. These end pieces may be arranged to provide a majority of the contribution to the transverse B0 imaging field.

The orientation sensor may comprise a transducer such as an encoder, arranged to provide a signal based on the position of the magnet assemblies and/or the rotatable mounting. The transducer may comprise a mechanical transducer, for example an electromechanical transducer, or electromagnetic transducer such as an optical transducer arranged to sense the position of the magnet assemblies or a magnetic field sensor arranged to sense the orientation of the B0 imaging field. In some embodiments the orientation sensor is coupled to sense the rotational position of the object, for example by sensing the position of a bed or support upon which the object is stabilised.

The rotatable mounting or mountings may be configured to enable rotation of the B0 imaging field about at least two mutually perpendicular axes, and the magnet assemblies may be coupled together so that the orientations of the two magnet assemblies are fixed to rotate together.

The yoke 16, 16' of each magnet assembly may comprise a seat for each magnetic element, and the axial height of each seat, for example the extent to which it protrudes from or is recessed into the yoke 16, 16' can also be selected based on the desired contribution to the B0 imaging field. The seats may be arranged so that one or more of the magnetic elements may be recessed into the yoke more or less than at least one other of the magnetic elements.

It will be appreciated in the context of the present disclosure that the magnetic field associated with the array of magnetic elements may be provided by a linear sum of the contribution from each of the magnetic elements, and that this can provide a numerical model of the magnetic field at a plurality of locations in the imaging region 22 between the two assemblies.

Where the magnetic field is to be measured in the imaging region this may be performed using magnetometers, or other methods of measuring the field. In some examples a water filled or gel filled container, or other homogeneous phantom may be arranged in the imaging region and the magnetic field in the imaging region can be determined based on images of the phantom, for example using a plurality of phase images each acquired using a different echo time. For example gradient echo, as opposed to spin echo, phase images may be used for this purpose. Low order (e.g. constant, and linear) B-field offsets may be measured in the k-space imaging data obtained in Fourier imaging methods such as EPI (Echo Planar Imaging). Other methods of measuring the magnetic field in the imaging region will be apparent in the context of the present disclosure.

As noted above, a transverse B0 imaging field can be provided in an imaging region between two magnet assemblies. This transverse B0 field may be perpendicular, or nearly perpendicular, to the direction of separation of the magnet assemblies. In this configuration the B0 imaging field can be rotated through a large angle, such as 180°, 270°, or 360° with respect to the imaging region by rotating the magnet assemblies about an axis aligned with their direction of separation. An object to be imaged however may be held fixed as the magnet assemblies, and hence the B0 field, are rotated. This can avoid or mitigate movement artefact and other errors which might otherwise arise. This option to rotate the $B_0$ field with respect to an imaging system may be further enhanced in a transverse field imaging apparatus where the two magnet assemblies comprise separate yokes. For example, two yokes may be mechanically coupled together and held spaced apart either side of the imaging region by a rigid separator. The separator may comprise a material of lower magnetic permeability than the yokes. The separator may comprise a rotatable mounting to enable the magnet assemblies to be rotated with respect to the separator and/or the imaging region. This can permit the magnet assemblies and the $B_0$ field to be rotated whilst an object is held stationary in the imaging region. For example, a patient's limb may be held still or immobilised in the imaging region whilst the $B_0$ field is rotated, and but because the yokes are separate, and can rotate, the patient's limb can remain still. The yokes may comprise a material of relatively high magnetic permeability, for example a ferromagnetic material or ferrimagnetic material, for example a ferrous or ferrite material for example, soft iron, soft steel material, and/or ceramics derived from iron oxides such as hematite ($Fe_2O_3$) or magnetite ($Fe_3O_4$) and/or oxides of other metals. The separator may comprise a material that is of lower permeability than the yokes, for example materials such as aluminium, austenitic stainless steel, carbon fibre, and/or polymeric or other generally non-magnetic materials.

Some methods of the disclosure relate to determining, for example obtaining, a signal based on an orientation of the $B_0$ imaging field, and storing an association between each image and the orientation of the $B_0$ imaging field when that image was acquired. The orientation may be determined from a sensor, such as the orientation sensor described above, but in some embodiments determining the orientation may simply comprise recording it because the orientation can be selected by an operator of the system. For example, in some embodiments the orientation of the magnet assemblies can be controlled (e.g. using a motor). Optionally a sensor such as an encoder can be used to confirm the desired magnet position.

Where an orientation sensor 502 is coupled to a rotational coupling this may comprise an encoder. In some embodiments the rotational coupling also comprises an actuator such as a mechanical mover, such as a motor. In these embodiments the controller 500 may be provided to control the actuator in response to an operator's command, and the controller 500 may be configured to compare a signal from the orientation sensor 502 with the expected position of the rotational coupling (e.g. the expected position based on the operator's command). The controller 500 may be configured to trigger an alert, for example to inhibit use of an imaging apparatus in the event that the orientation sensor 502 signal does not match with the expected position. In some examples an orientation sensor signal may be obtained based on the MRI images—for example based on landmarks in the MRI image associated with at least one marker coupled to the object in the imaging region—for example the markers may comprise one or more objects such as containers of water or other substance which provides an MRI signal. The orientation signal can then be determined based on the landmarks in the image provided by these markers. Landmark sensors may also be useful for detecting small residual involuntary patient movement in a nominally constrained patient.

Some embodiments of the disclosure may comprise an eddy current inhibitor, adapted to inhibit the generation of eddy currents in the yoke 16, 16' of the magnet assemblies, for example configured to inhibit eddy currents generated by gradient coils of an MRI imaging system which is used with the magnet assembly. The eddy current inhibitor may be arranged between a magnet assembly and the yoke to which it is secured.

One such eddy current inhibitor comprises electrical insulator which insulates some regions of the surface of the yoke from other regions, for example the insulator may be interspersed with the material of the yoke to provide a tiled and/or laminated layer, in some embodiments the eddy current inhibitor may comprise a layer of powdered iron or other ferrous material. This layer may be arranged adjacent to the surface of the yoke between the yoke and the magnet assemblies that are carried by the yoke.

References to magnetic elements, arrays of such elements, and their surfaces, shapes, and geometries, and the magnetic fields associated with them may apply to either modelled data or physical apparatus.

Magnet assemblies of the present disclosure may be arranged in two halves. One half of each magnet assembly may provide a "North" pole having a net magnetisation directed into the imaging region, e.g. aligned with the direction of separation of the two magnet assemblies. The other half of each magnet assembly may provide a "South" pole, having a net magnetisation directed in the opposite direction, e.g. aligned with the direction of separation but pointing away from the imaging region. The North poles may be arranged towards the same end of each magnet assembly, and the south poles may be arranged towards the other end so that the North poles face each other at one end of the imaging region and South poles face each other at the other end of the imaging region. The North and South pole of each magnet assembly may comprise an array of magnetic elements.

The disclosure is presented with reference to the imaging of tissue structures, but it will be appreciated that this is merely exemplary, and apparatus and methods described herein may also be applied to the imaging of objects that are not associated with, or even derived from, human or animal bodies. In addition, because proton based imaging is common, the methods described herein make reference to the imaging of water. It will however be appreciated that imaging sequences may be adapted for imaging other nuclear species such as Carbon-13 to name just one example.

Self-evidently, the principles of the present disclosure are not dependent on the object which is to be imaged.

In some embodiments MRI images discussed in the present disclosure are to be obtained using an imaging sequence which is configured to be more sensitive to contrast associated with the transverse relaxation time T2 than to contrast associated with the longitudinal (spin-lattice) relaxation time, T1, in human or animal tissue. As will be appreciated in the context of the present disclosure the longitudinal (spin-lattice) relaxation time, T1, is the time constant which characterises the rate at which the magnetisation of an object recovers its equilibrium value after being flipped by a 90° RF pulse.

An embodiment of the disclosure provides a computer implemented transverse field magnetic resonance imaging method. In this method, a first MRI image of an object in an imaging region between two magnet assemblies is obtained based on a $B_0$ imaging field in the imaging region. The $B_0$ imaging field is transverse to the direction of separation of the magnet assemblies. The method then comprises sending a signal to cause the magnet assemblies to be rotated about the object thereby to change the orientation of the $B_0$ imaging field with respect to the object. A second MRI image of the object can then be obtained, and composite image data is provided based on both the first MRI image and the second MRI image. Sending the signal may comprise controlling an actuator to cause the magnet assemblies to be rotated about the object, or providing a signal to an operator to indicate a required rotation of the magnet assemblies. The method may further comprise rotating the magnet assemblies about the object. Providing composite image data may comprise fitting a signal model to the first image data and the second image data. The signal model may comprise a model of the magic angle effects, e.g. the model may comprise a term which varies as $3\cos 2\theta - 1$. The range of angles $\theta$ that are used in this fitting procedure may be selected based on a priori knowledge and/or anatomical data as described above.

The disclosure is presented with reference to the imaging of tissue structures, but it will be appreciated that this is merely exemplary, and apparatus and methods described herein may also be applied to the imaging of objects that are not associated with, or even derived from, human or animal bodies. Methods and apparatus of the present disclosure have particular utility in imaging anisotropic structures within objects, for example structures in which the magic angle effects provide a measureable variation in signal intensity as a function of the angle of orientation of that structure with respect to the $B_0$ imaging field. In addition, because proton based imaging is common, the methods described herein make reference to the imaging of water. It will however be appreciated that imaging sequences may be adapted for imaging other nuclear species such as Carbon-13 to name just one example. Self-evidently, the principles of the present disclosure are not dependent on the object which is to be imaged.

In some embodiments MRI images discussed in the present disclosure are to be obtained using an imaging sequence which is configured to be more sensitive to contrast associated with the transverse relaxation time T2 than to contrast associated with the longitudinal (spin-lattice) relaxation time, T1, in human or animal tissue. As will be appreciated in the context of the present disclosure the longitudinal (spin-lattice) relaxation time, T1, is the time constant which characterises the rate at which the magnetisation of an object recovers its equilibrium value after being flipped by a 90° RF pulse.

To the extent that certain methods may be applied to the living human or animal body, it will be appreciated that such methods may not provide any surgical or therapeutic effect. In addition, it will be appreciated that such methods may be applied ex vivo, to tissue samples that are not part of the living human or animal body. For example, the methods described herein may be practices on meat, tissue samples, cadavers, and other non-living objects.

With reference to the drawings in general, it will be appreciated that schematic functional block diagrams are used to indicate functionality of systems and apparatus described herein. It will be appreciated however that the functionality need not be divided in this way, and should not be taken to imply any particular structure of hardware other than that described and claimed below. The function of one or more of the elements shown in the drawings may be further subdivided, and/or distributed throughout apparatus of the disclosure. In some embodiments the function of one or more elements shown in the drawings may be integrated into a single functional unit.

The above embodiments are to be understood as illustrative examples. Further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

Magnetic resonance imaging control systems are known in the art. For example, commercial RF controllers for controlling the transmission and reception of RF signals are known. Systems for controlling magnetic field gradients in imaging systems so as to implement imaging sequences are also known. Such systems may comprise programmable controllers, adapted to implement MRI sequences and to collect the resulting data.

In some examples, one or more memory elements can store data and/or program instructions for such programmable controllers used to implement the operations described herein. Embodiments of the disclosure provide tangible, non-transitory storage media comprising program instructions operable to program a processor to perform any one or more of the methods described and/or claimed herein and/or to provide data processing apparatus as described and/or claimed herein.

The activities and apparatus outlined herein may be implemented with fixed logic such as assemblies of logic gates or programmable logic such as software and/or computer program instructions executed by a processor. Other kinds of programmable logic include programmable processors, programmable digital logic (e.g., a field programmable gate array (FPGA), an erasable programmable read only memory (EPROM), an electrically erasable programmable read only memory (EEPROM)), an application specific integrated circuit, ASIC, or any other kind of digital logic, software, code, electronic instructions, flash memory, optical disks, CD-ROMs, DVD ROMs, magnetic or optical cards, other types of machine-readable mediums suitable for storing electronic instructions, or any suitable combination thereof.

The invention claimed is:

1. A magnetic resonance imaging method comprising:
obtaining a first MRI image of an object immobilized in an imaging region, the first MRI image being obtained based on a generally homogeneous $B_0$ imaging field having a first orientation;
rotating, with respect to the object immobilized in the imaging region, the generally homogeneous $B_0$ field from the first orientation to a second orientation;
obtaining at least a second MRI image of the object immobilized in the imaging region, the second MRI image being obtained based on the generally homogeneous $B_0$ imaging field having the second orientation; and
determining an orientation of a structure within the object based on the first orientation, the second orientation and an image intensity associated with the structure in the first MRI image and in the second MRI image.

2. The method of claim 1, wherein the determining comprises estimating a relationship between the orientation of the generally homogeneous $B_0$ imaging field and the image intensity associated with the structure, wherein the relationship is estimated based on a model of magic angle effect.

3. The method of claim 1, further comprising obtaining a plurality of additional MRI images of the object, each at a different orientation of the $B_0$ imaging field, and in which the determining is further based on the image intensity associated with the structure in the images, and the respective orientations of the generally homogeneous $B_0$ imaging field associated with the images.

4. The method of claim 1, further comprising obtaining an orientation of the $B_0$ imaging field, and storing an association between each image and the orientation of the generally homogeneous $B_0$ imaging field when that image was acquired.

5. The method of claim 4, further comprising obtaining a composite image based on at least the first MRI image, and the second MRI image, and the stored associations.

6. The method of claim 5, wherein the composite image comprises: a plurality of voxels, each associated with a volume element of the object, and each voxel comprises an indication of the orientation of a structure which occupies said volume element.

7. The method of claim 5, further comprising combining said composite image with a structural image of the object for display to a user.

8. The method of claim 1, wherein changing the orientation of the generally homogeneous $B_0$ imaging field with respect to the object comprises selecting an orientation based on the image intensity associated with the structure in at least one preceding image.

9. The method of claim 8, further comprising selecting an orientation to increase the transverse relaxation time T2 of the MRI signal provided by the structure, based on anatomical data and/or a priori knowledge of an approximate orientation of the structure.

10. The method of claim 1, wherein the structure within the object comprises a structure for which the signal intensity is dependent upon its orientation with respect to the generally homogeneous $B_0$ imaging field, in which the transverse relaxation time is dependent upon the orientation of the structure with respect to the generally homogeneous $B_0$ imaging field.

11. The method of claim 1, wherein the orientation of the generally homogenous $B_0$ imaging field is determined based on a sensor signal obtained from sensing a rotational orientation of the magnet assemblies.

12. The method of claim 1, wherein the orientation of the generally homogenous $B_0$ imaging field is determined based on one of: (a) magnetically sensing the generally homogeneous $B_0$ imaging field and (b) based on the MRI images wherein the MRI images comprise image landmarks associated with at least one marker coupled to the object in the imaging region, and the orientation of the generally homogeneous $B_0$ imaging field is determined based on the landmarks.

13. The method of claim 1, wherein the imaging region lies between two magnet assemblies arranged to provide the generally homogeneous $B_0$ imaging field in the imaging region transverse to the direction of separation of the magnet assemblies.

14. The method of claim 1, wherein changing the orientation of the $B_0$ field comprises causing the magnet assemblies to be rotated about at least two axes of rotation.

15. The method of claim 1, wherein at least one of the MRI images is obtained using an imaging sequence which is configured to be more sensitive to T2 contrast than to T1 contrast in human or animal tissue.

16. The method of claim 1, wherein the orientation of the generally homogenous $B_0$ imaging field is selected based on the orientation of at least one structure in the object.

17. An imaging apparatus comprising a rotatable magnet assembly, that provides a rotatable generally homogeneous $B_0$ imaging field, and a controller configured to control the imaging apparatus to perform a method comprising:
obtaining a first MRI image of an object immobilized in an imaging region, the first MRI image being based on a generally homogeneous $B_0$ imaging field having a first orientation;
rotating, with respect to the object immobilized in the imaging region, the generally homogenous $B_0$ field form the first orientation to a second orientation;
obtaining at least a second MRI image of the object immobilized in the imaging region, the second MRI image being obtained based on the generally homogenous $B_0$ imaging field having the second orientation; and
determining an orientation of a structure within the object based on the first orientation, the second orientation, and an image intensity associated with the structure in the first MRI image, and in the second MRI image.

18. The imaging apparatus of claim 17, further comprising:
at least two magnet assemblies separated by an imaging region and arranged to provide the generally homogeneous $B_0$ imaging field in the imaging region transverse to the direction of separation of the magnet assemblies; and
a gradient winding configured to provide imaging gradients for obtaining magnetic resonance images from the imaging region.

19. The imaging apparatus of claim 17, further comprising additional passive or dynamic shimming elements to improve the homogeneity of the generally homogeneous $B_0$ field.

20. A non-transitory computer-readable media comprising program instructions configured to program a programmable processor of magnetic resonance imaging apparatus comprising a rotatable magnet assembly, that provides a rotatable generally homogenous $B_0$ imaging field, and wherein the programmable processor is configured to perform a method comprising:

obtaining a first MRI image of an object in an imaging region based on a generally homogenous $B_0$ imaging field wherein the magnetic resonance imaging apparatus comprises a rotatable generally homogeneous $B_0$ imaging field, and a controller configured to control the imaging apparatus and the method further comprising;

rotating the generally homogeneous $B_0$ imaging field to change the orientation of the $B_0$ imaging field with respect to the object;

obtaining at least a second MRI image of the object; and determining an orientation of a structure within the object based on the orientations of the $B_0$ imaging field with respect to the object, and an image intensity associated with the structure in the first MRI image, and in the second MRI image.

* * * * *